(12) United States Patent
Wu et al.

(10) Patent No.: US 12,324,230 B2
(45) Date of Patent: Jun. 3, 2025

(54) SEMICONDUCTOR DEVICE AND METHOD

(71) Applicant: Taiwan Semiconductor Manufacturing Co., Ltd., Hsinchu (TW)

(72) Inventors: Hsi-Jung Wu, Kaohsiung (TW); Sheng-Fu Yu, Chiayi (TW); Ru-Shang Hsiao, Jhubei (TW); Ying-Hsin Lu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 524 days.

(21) Appl. No.: 17/534,038

(22) Filed: Nov. 23, 2021

(65) Prior Publication Data
US 2022/0223590 A1 Jul. 14, 2022

Related U.S. Application Data

(60) Provisional application No. 63/136,880, filed on Jan. 13, 2021.

(51) Int. Cl.
*H10D 84/83* (2025.01)
*H01L 21/762* (2006.01)
*H10D 30/01* (2025.01)

(52) U.S. Cl.
CPC ......... *H10D 84/834* (2025.01); *H01L 21/762* (2013.01); *H10D 30/024* (2025.01)

(58) Field of Classification Search
CPC ............... H01L 27/0886; H01L 21/762; H01L 29/66795; H01L 21/823431; H01L 21/76224; H01L 21/823821; H01L 21/823828; H01L 21/823864; H01L 27/0924; H01L 29/785; H10D 84/834; H10D 30/024; H10D 84/0107; (Continued)

(56) References Cited

U.S. PATENT DOCUMENTS 9,412,814 B2 * 8/2016 Lee .................. H10D 30/62
9,899,363 B1 * 2/2018 Bahr ................ H01L 23/53214
(Continued)

FOREIGN PATENT DOCUMENTS

KR  20160078230 A    7/2016
TW    201338133 A  *  9/2013  ..... H01L 21/823431
(Continued)

*Primary Examiner* — Mohammed Shamsuzzaman
(74) *Attorney, Agent, or Firm* — Slater Matsil, LLP

(57) ABSTRACT

An embodiment includes a semiconductor device, a plurality of fin structures extending from a substrate, the plurality of fin structures having a plurality of first fin structures and a plurality of second fin structures. The semiconductor device also includes a plurality of isolation regions on the substrate and disposed between the plurality of fin structures. The device also includes a plurality of gate structures on the plurality of isolation regions. The device also includes a plurality of epitaxy structures on one of the plurality of first fin structures. The device also includes a plurality of contact structures on the plurality of epitaxy structures, where the plurality of first fin structures, the plurality of gate structures, the plurality of epitaxy structures, and the plurality of contact structures are components of one or more resonators.

14 Claims, 29 Drawing Sheets

(58) Field of Classification Search
CPC ... H10D 48/071; H10F 30/2863; H10F 99/00; A23B 2/783; A23B 11/29; A01K 67/61; H10H 20/851

See application file for complete search history.

(56) References Cited

U.S. PATENT DOCUMENTS

| | | | | |
|---|---|---|---|---|
| 9,922,979 | B2* | 3/2018 | Chung | H01L 21/823878 |
| 10,002,859 | B1* | 6/2018 | Bahr | H03H 9/2405 |
| 10,134,847 | B2 | 11/2018 | Yeh et al. | |
| 10,741,669 | B2* | 8/2020 | Leib | H10F 39/193 |
| 10,892,335 | B2* | 1/2021 | Ma | H10D 62/121 |
| 11,201,151 | B2* | 12/2021 | Hudeczek | H01L 29/0673 |
| 11,323,070 | B1* | 5/2022 | Pretl | H10D 30/6211 |
| 2014/0131813 | A1* | 5/2014 | Liaw | H01L 27/0207 438/689 |
| 2015/0093878 | A1* | 4/2015 | Wu | H01L 29/66795 438/424 |
| 2015/0303118 | A1* | 10/2015 | Wang | H10D 84/0149 257/401 |
| 2016/0322462 | A1* | 11/2016 | Chou | H01L 29/7849 |
| 2017/0140992 | A1* | 5/2017 | Chang | H01L 21/0332 |
| 2018/0174953 | A1* | 6/2018 | Nam | H01L 29/6681 |
| 2018/0225404 | A1* | 8/2018 | Wang | H01L 27/0886 |
| 2018/0330994 | A1* | 11/2018 | Zang | H01L 21/845 |
| 2019/0103309 | A1* | 4/2019 | Lin | H01L 21/31116 |
| 2020/0027735 | A1* | 1/2020 | Wang | H01L 29/6681 |
| 2020/0176591 | A1* | 6/2020 | Wong | H10D 64/017 |
| 2020/0212193 | A1* | 7/2020 | Gosavi | H10D 64/689 |
| 2020/0212194 | A1* | 7/2020 | Gosavi | H03H 9/02259 |
| 2021/0013337 | A1* | 1/2021 | Chan | H10D 62/151 |
| 2021/0066100 | A1* | 3/2021 | Liaw | H01L 21/0334 |
| 2021/0265350 | A1* | 8/2021 | Chin | H01L 21/823481 |
| 2021/0305245 | A1* | 9/2021 | Hudeczek | H01L 29/0673 |
| 2021/0375695 | A1* | 12/2021 | Chen | H01L 21/0337 |
| 2022/0102339 | A1* | 3/2022 | Then | H01L 25/10 |
| 2022/0102344 | A1* | 3/2022 | Then | H01L 27/0688 |
| 2022/0311413 | A1* | 9/2022 | Hager | H03H 9/2405 |

FOREIGN PATENT DOCUMENTS

| | | | | |
|---|---|---|---|---|
| TW | 201344915 A | * | 11/2013 | ..... H01L 21/823431 |
| TW | I590451 B | | 7/2017 | |

* cited by examiner

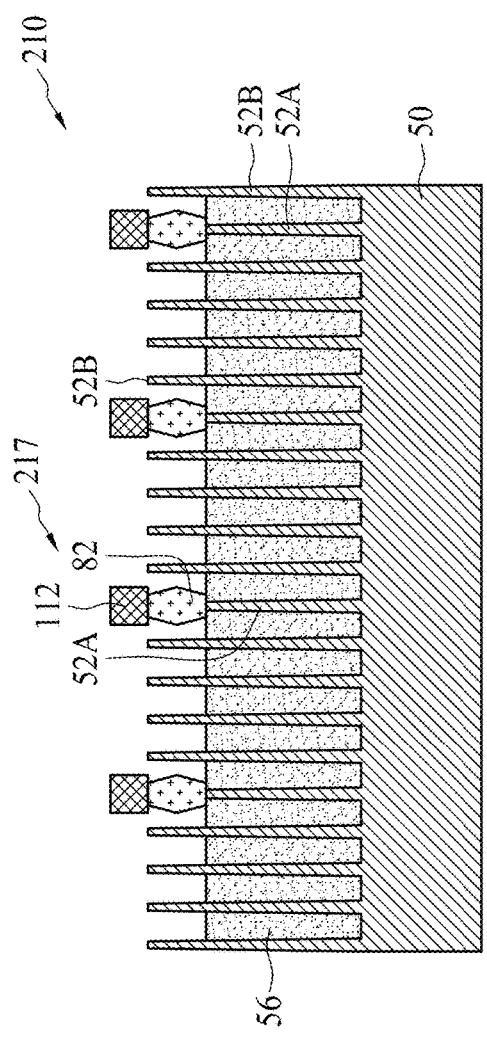
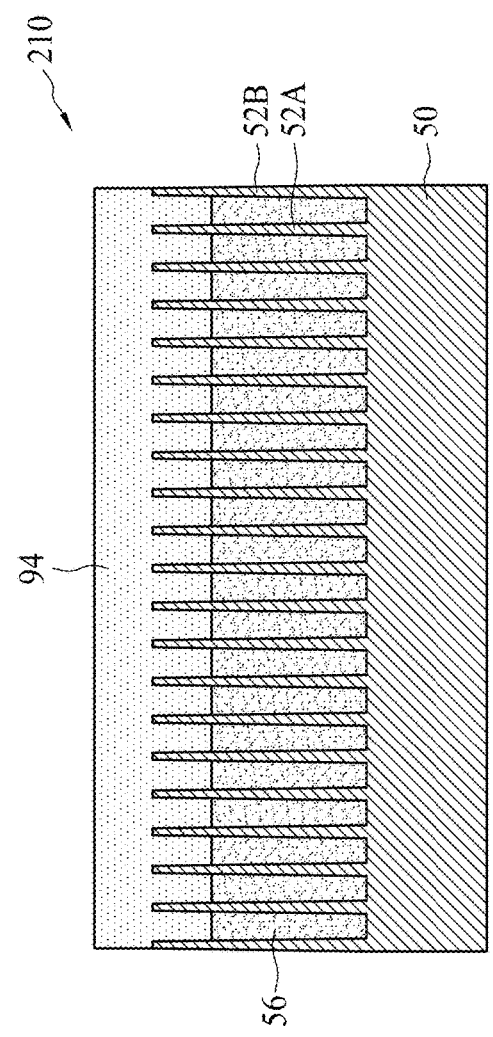
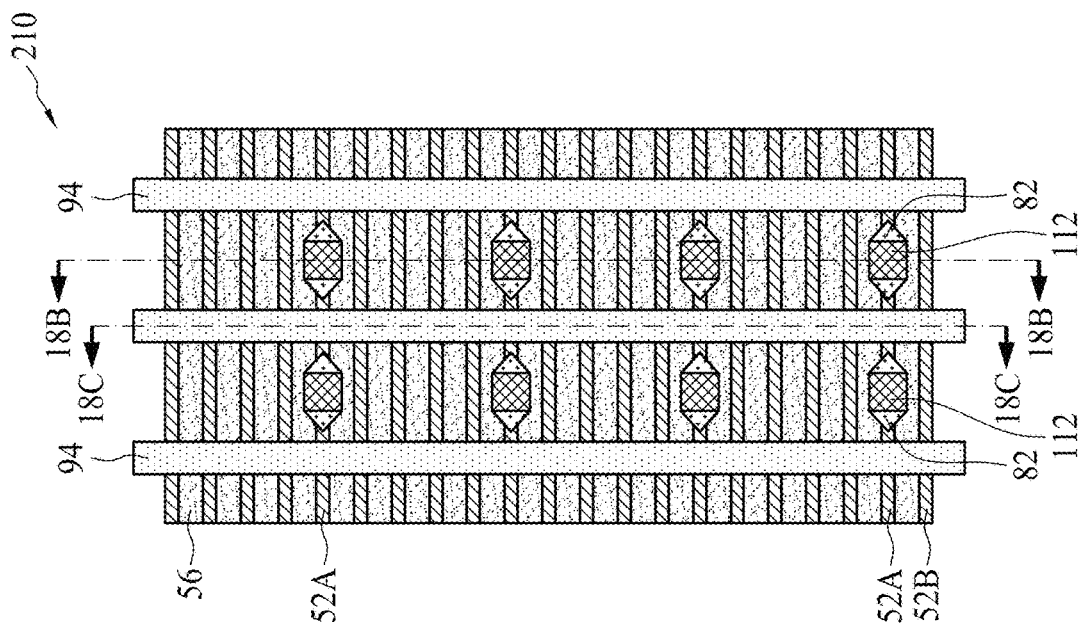
Figure 18B
Figure 18C
Figure 18A

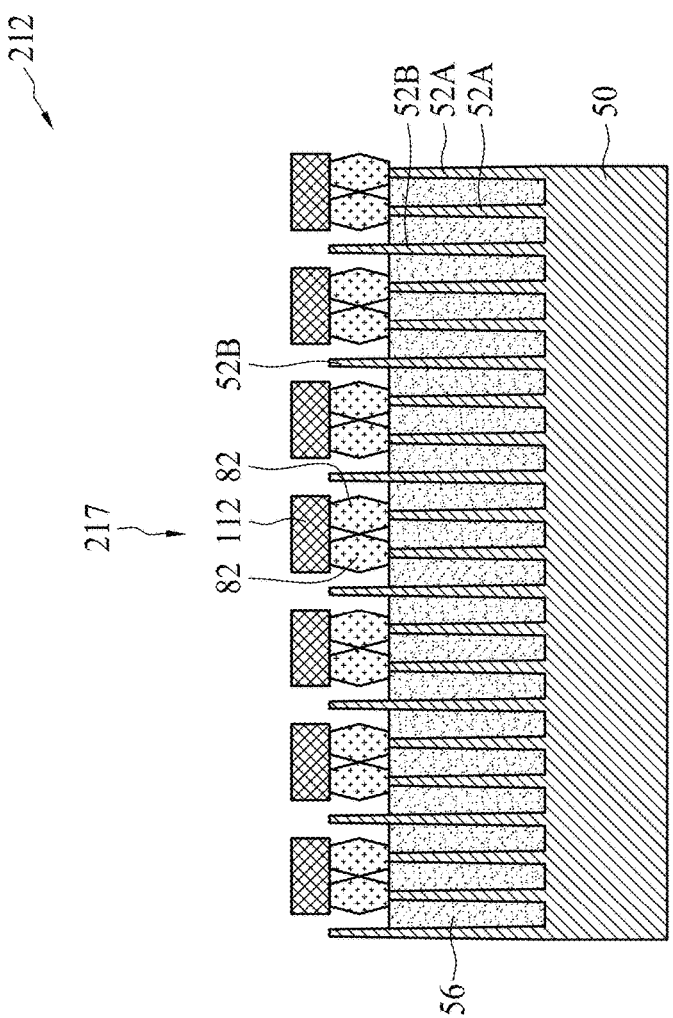
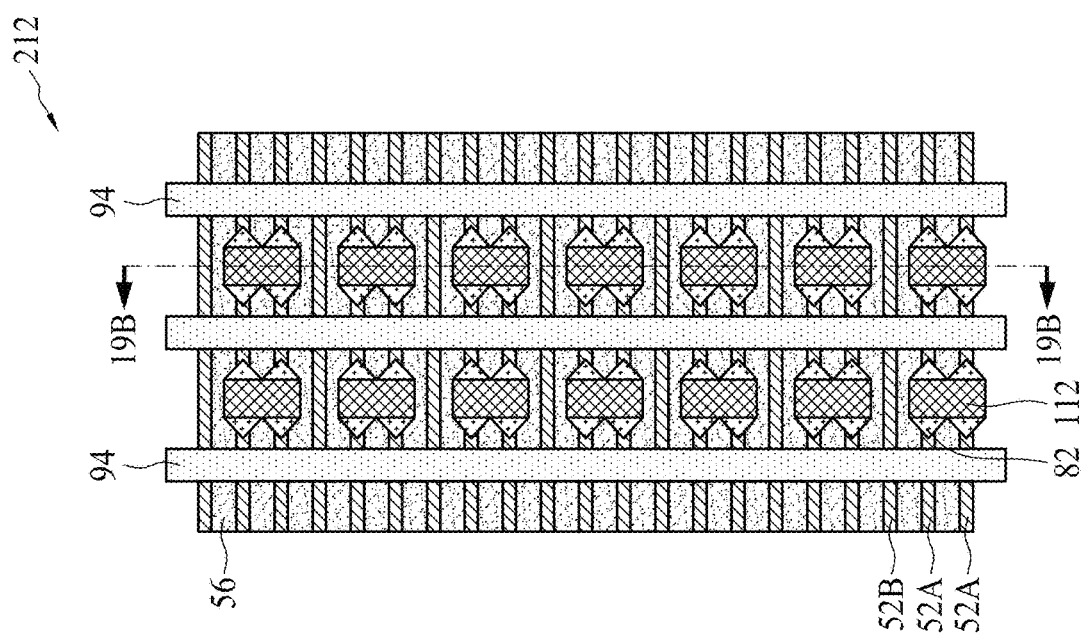
Figure 19A
Figure 19B

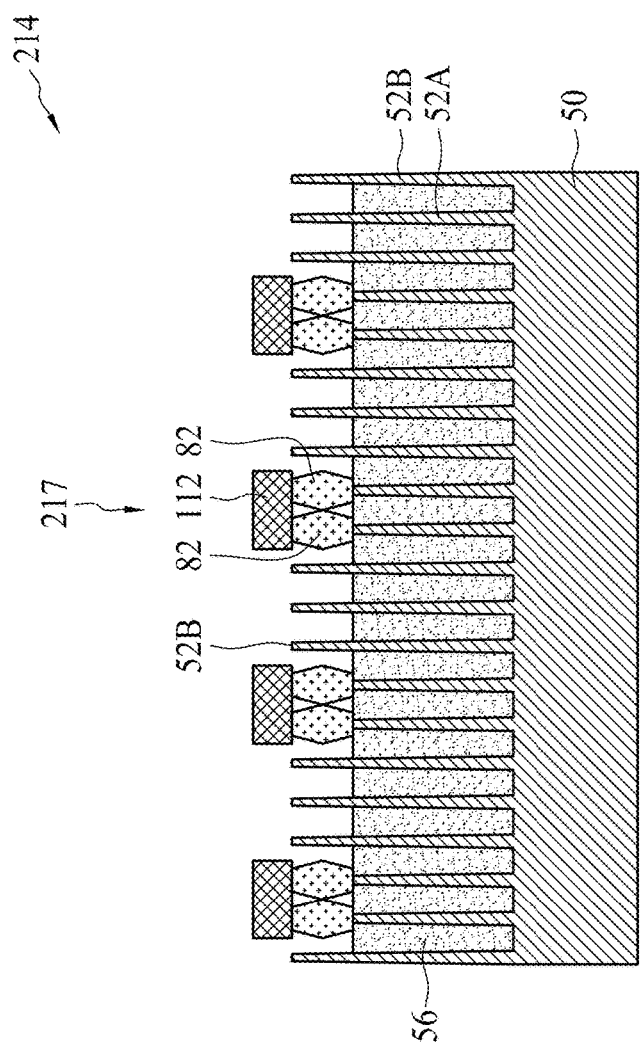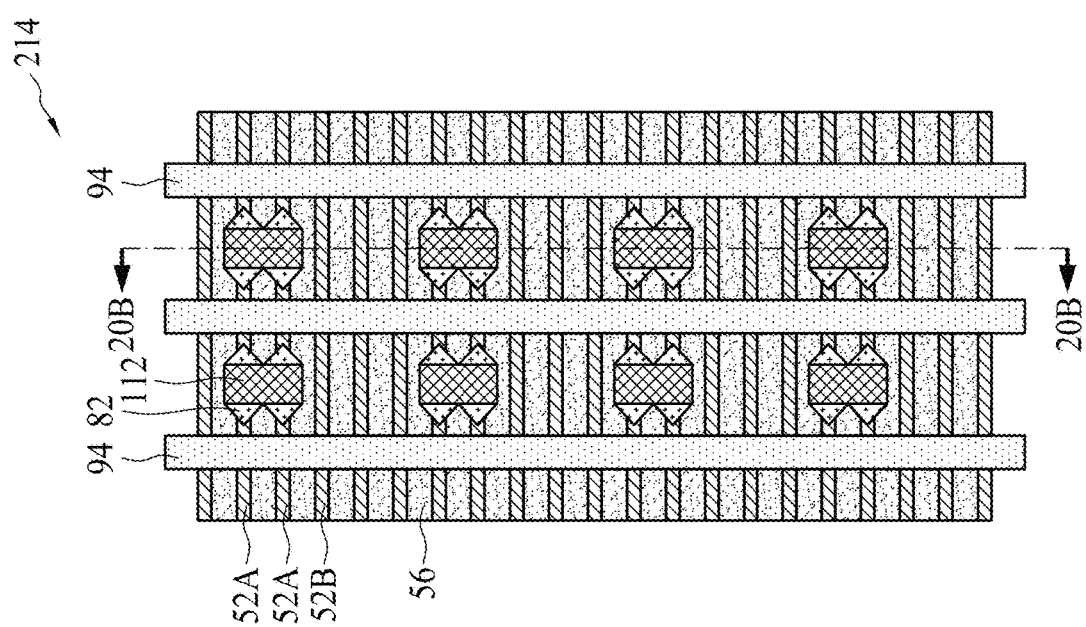
Figure 20A
Figure 20B

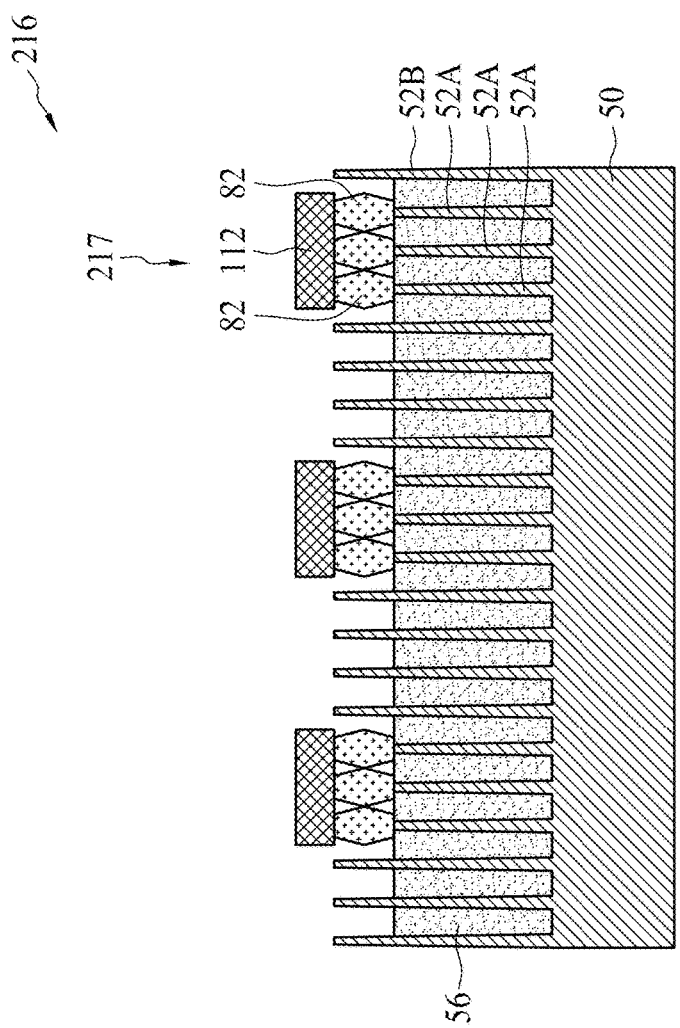
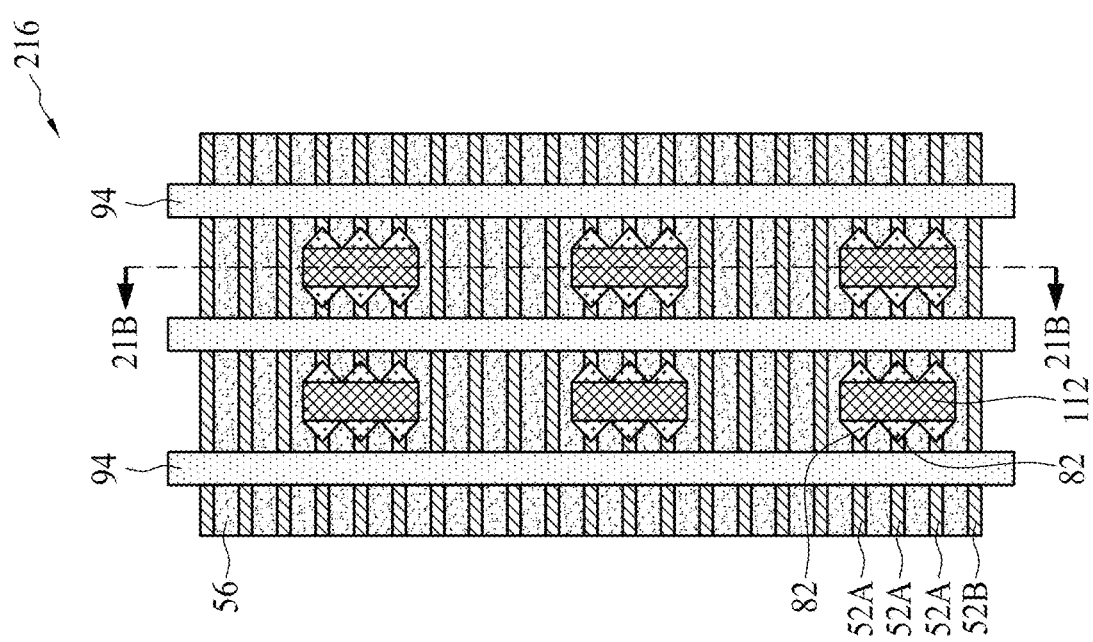
Figure 21B
Figure 21A

SEMICONDUCTOR DEVICE AND METHOD

PRIORITY CLAIM AND CROSS-REFERENCE

This application claims the benefit of U.S. Provisional Application No. 63/136,880, filed on Jan. 13, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18A, 18B, 18C, 19A, 19B, 20A, 20B, 21A, 21B, 22, 23, 24, and 25 illustrate top views and cross-sectional views of various configurations of semiconductor devices in accordance with some embodiments.

DETAILED DESCRIPTION

Figure 1:
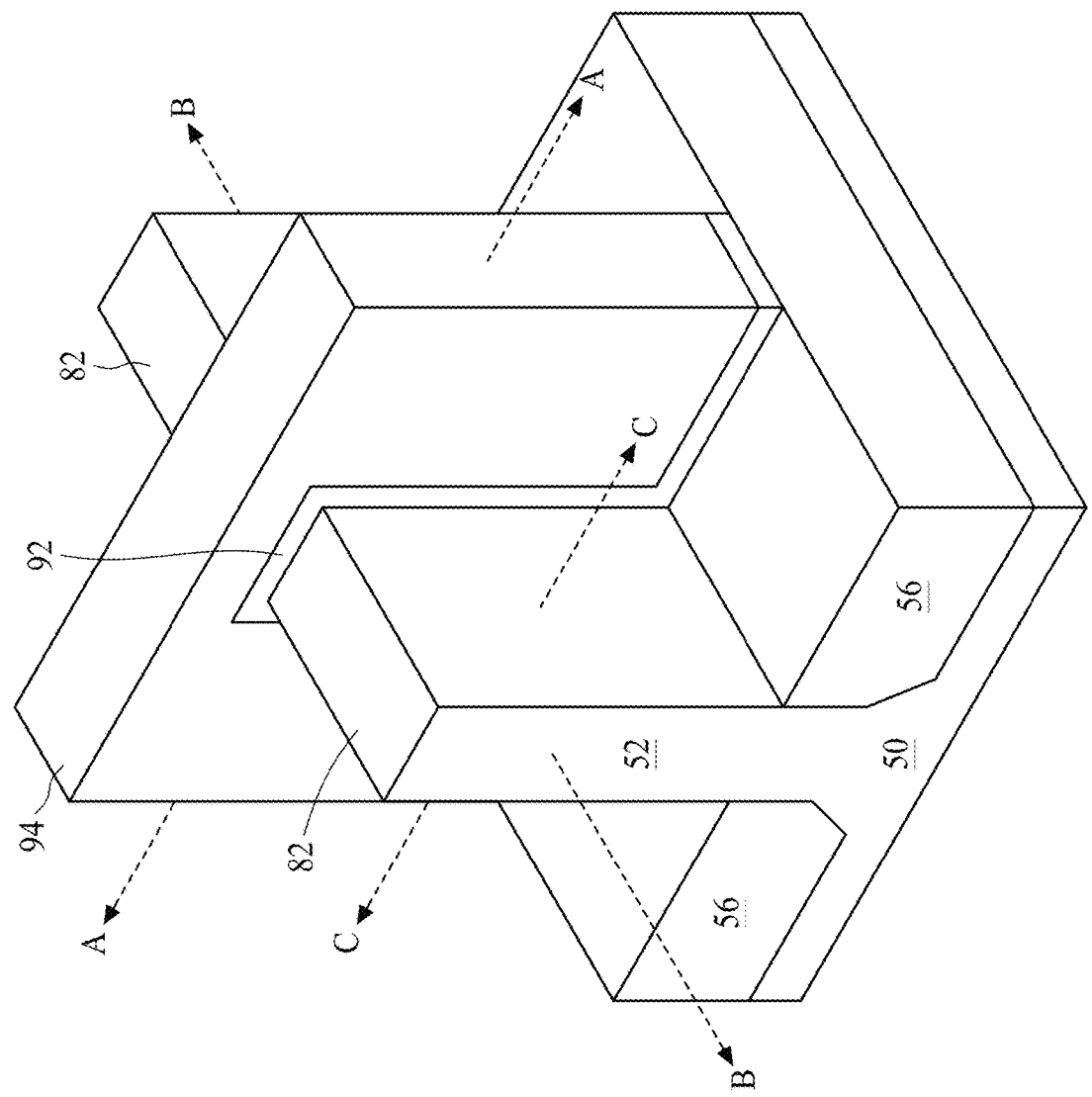
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. In general terms, the present disclosure is a device and method of forming the same to use a fin structure to make a resonator which may be used as a frequency source in circuits. In some embodiments, the frequency generated by the device is determined by the fin material and the fin pitch. The device design allows for this structure to be better integrated into complementary metal-oxide-semiconductor (CMOS) process flows. The disclosed embodiments allow for the device to generate more than one frequency in one structure while also simplifying process and not requiring special packaging.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 17 are cross-sectional views of intermediate stages in the manufacturing of FinFETs, in accordance with some embodiments. FIGS. 2, 3A, 3B, 4, 5, 6, and 7 illustrate reference cross-section A-A illustrated in FIG. 1, except for multiple fins/FinFETs. FIGS. 8A, 9A, 10A, 11A, 12A, 13A, 14A, 15A, and 16A are illustrated along reference cross-section A-A illustrated in FIG. 1, and FIGS. 8B, 9B, 10B, 11B, 12B, 13B, 14B, 14C, 15B, and 16B are illustrated along a similar cross-section B-B illustrated in FIG. 1, except for multiple fins/FinFETs. FIGS. 10C, 10D, 10E, and 17 are illustrated along reference cross-section C-C illustrated in FIG. 1, except for multiple fins/FinFETs.

Figure 2:
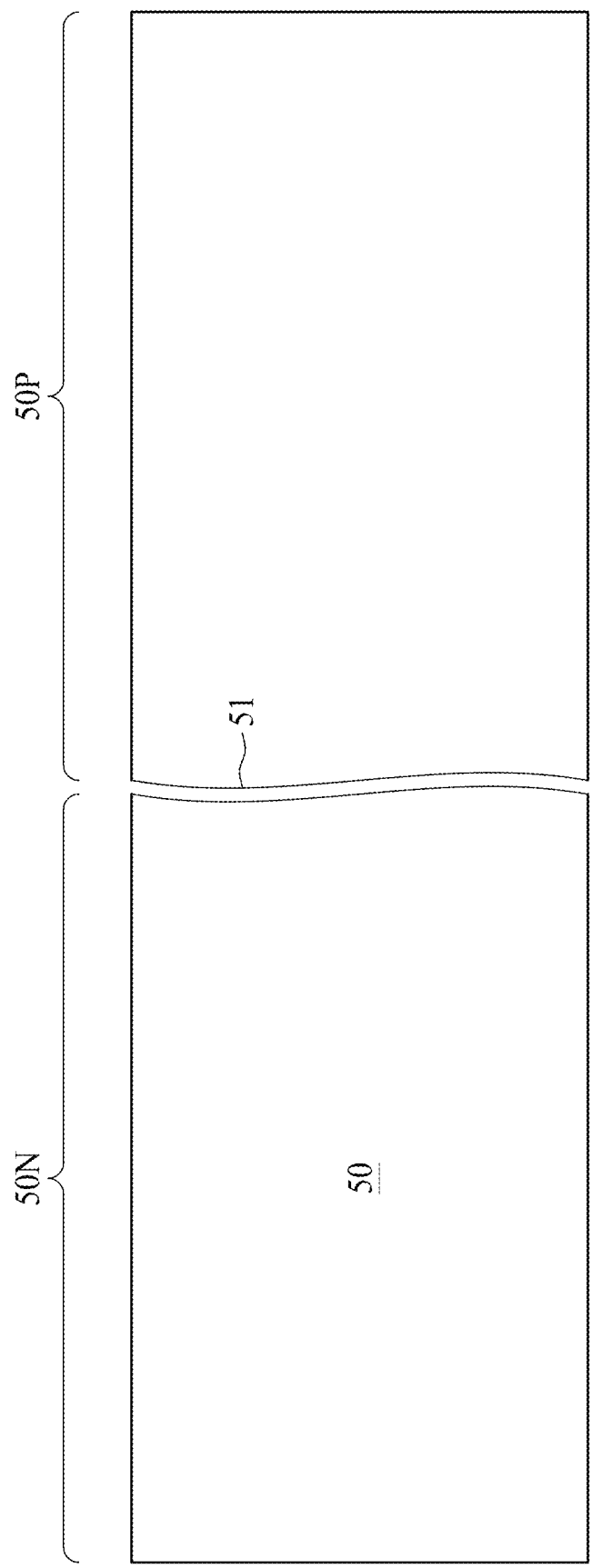
FIGS. 2, 3A, 3B, 4, 5, 6, 7, 8A, 8B, 9A, 9B, 10A, 10B, 10C, 10D, 10E, 11A, 11B, 12A, 12B, 13A, 13B, 14A, 14B, 14C, 15A, 15B, 16A, 16B, 17 are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3A:
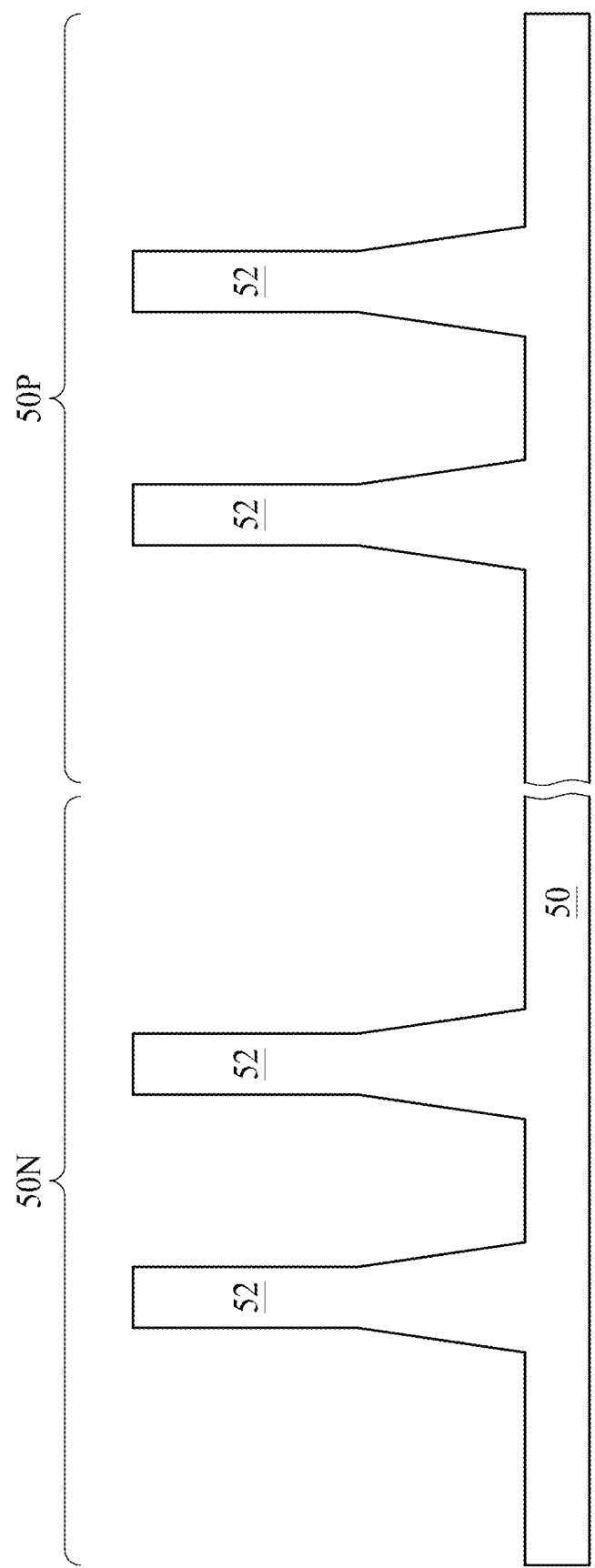
Figure 3B:
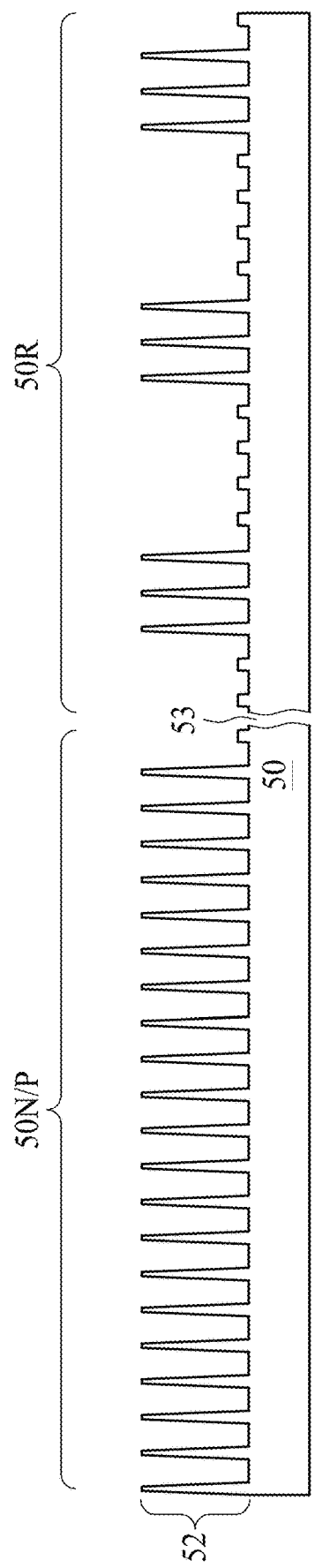

In FIGS. 3A and 3B, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

As illustrated in FIG. 3B, the substrate 50 has device region 50N/P (e.g., regions where the n-type regions 50N and a p-type region 50P are located) and a resonator device region 50R. The device region 50N/P can be a region for forming logic devices, memory devices, input/output devices, or the like. The resonator device region 50R can be for forming resonator devices. The device region 50N/P may be physically separated from the resonator device region 50R (as illustrated by divider 53), and any number of device features (e.g., other active devices, doped regions, isolation structures, etc.) may be disposed between the regions. Although the resonator device region 50R is not shown at every step, the device regions 50N/P and the resonator device region 50R are formed at the same time by the same processes.

As illustrated in FIG. 3B, in the resonator device region 50R, some fins may be removed by a fin cut process. In some embodiments, the fin cut process includes masking the fins 52 that are desired to remain while etching the exposed fins 52. In some embodiments, the masking may be achieved using a photoresist and/or other masks (not shown). For example, a photoresist may be formed over the fins 52 and the photoresist is patterned to expose the fins that are to be removed. An etching process may then be performed to remove the exposed fins 52. The etching may be any acceptable etch process, such as a RIE, NBE, the like, or a combination thereof. The etch may be anisotropic or isotropic. After the etching, the photoresist may be removed.

Figure 4:
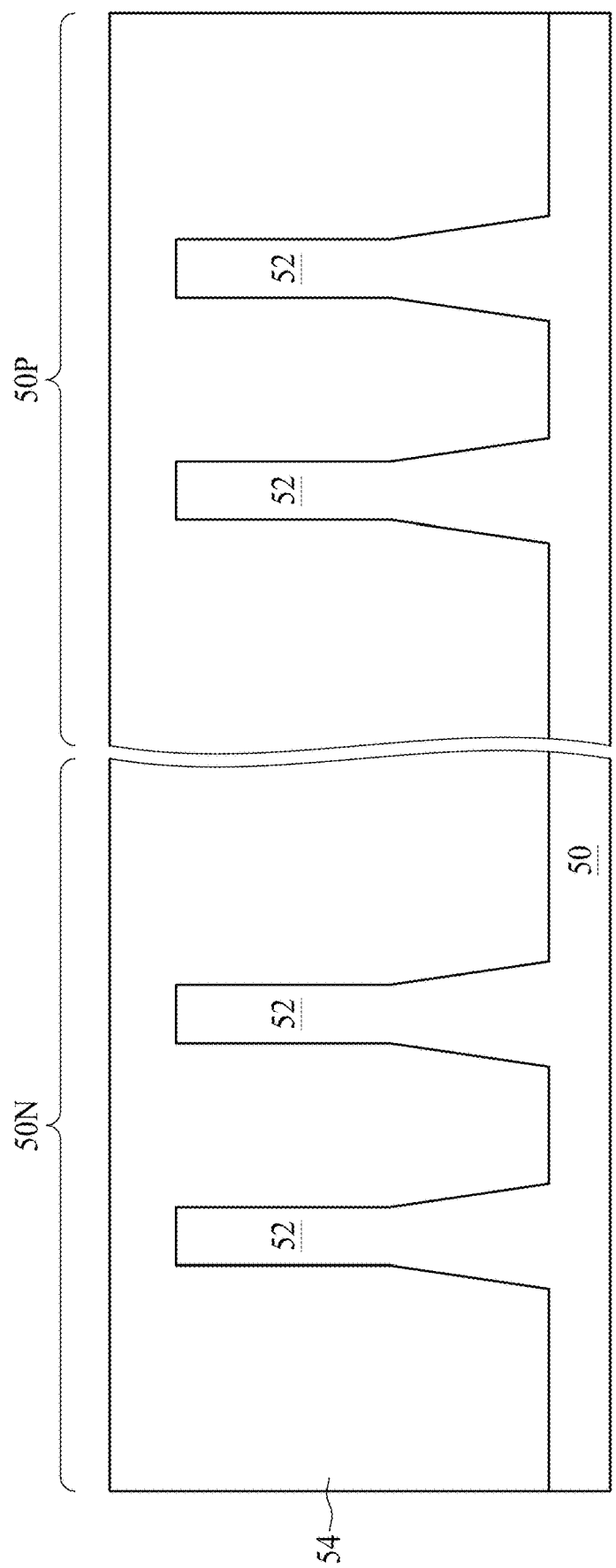

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
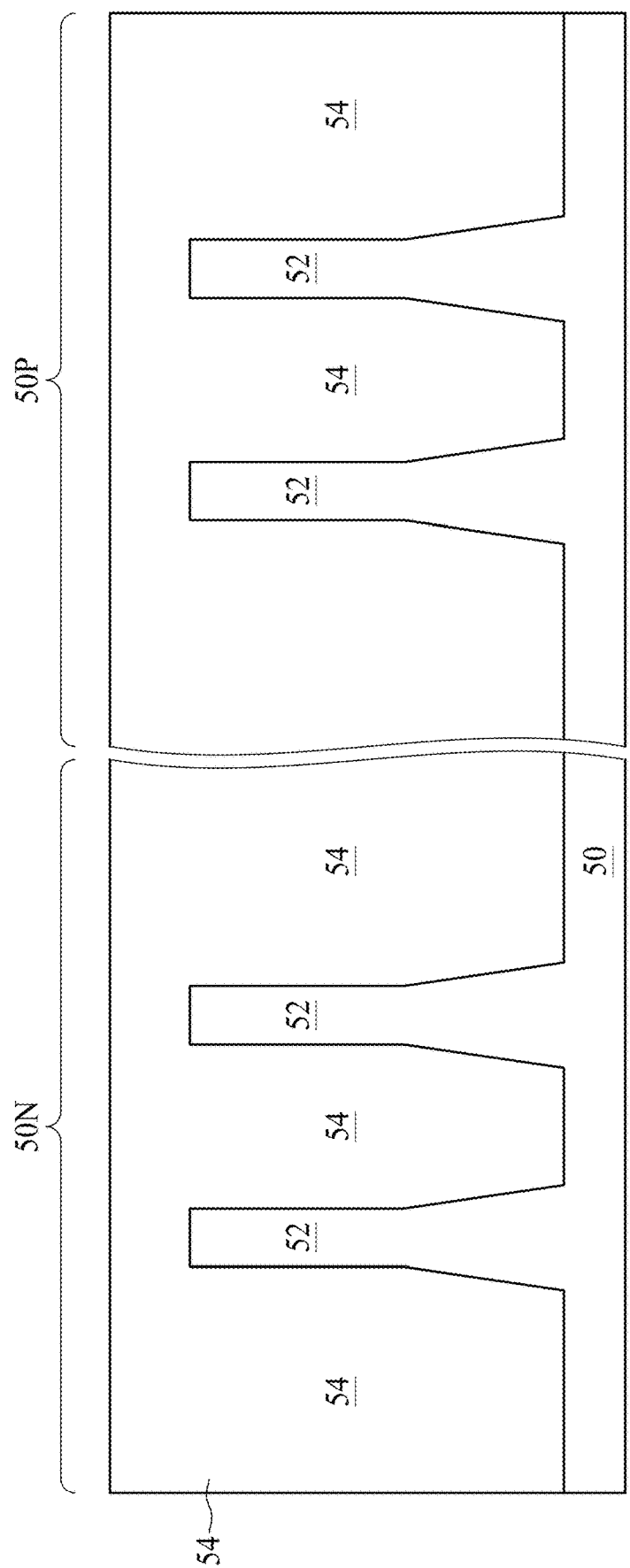

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
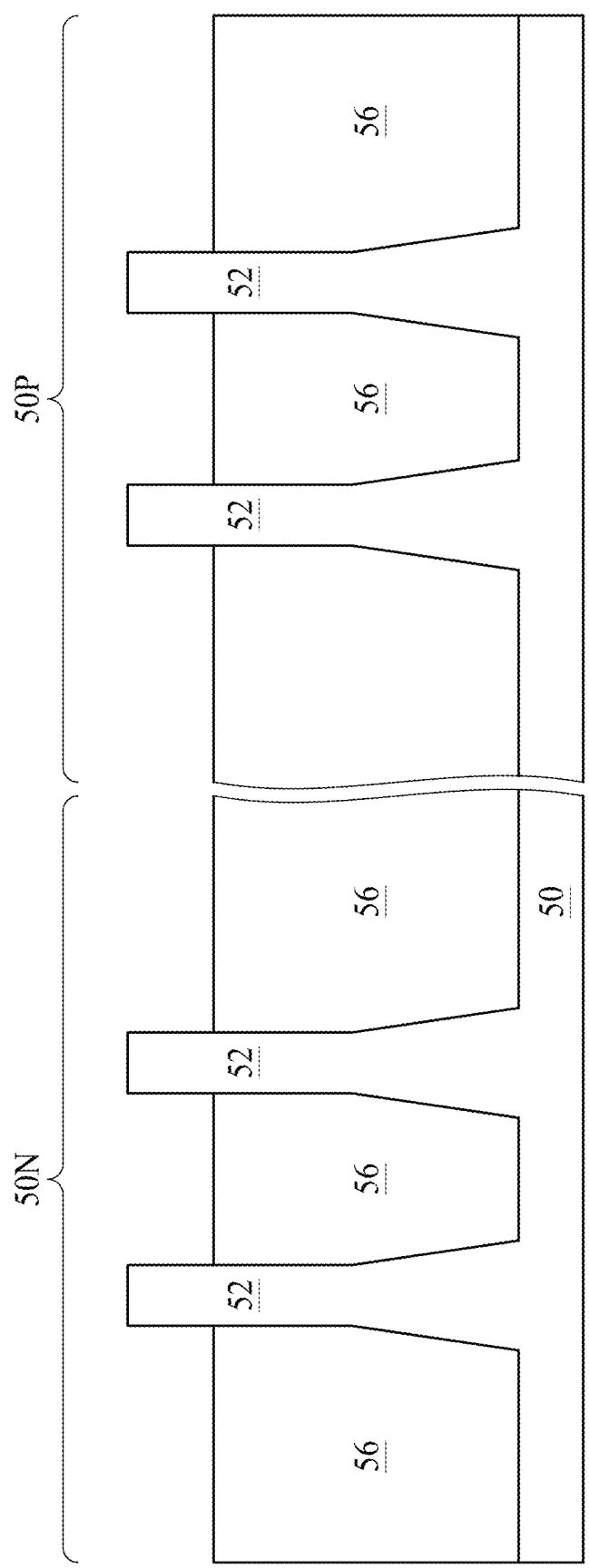

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
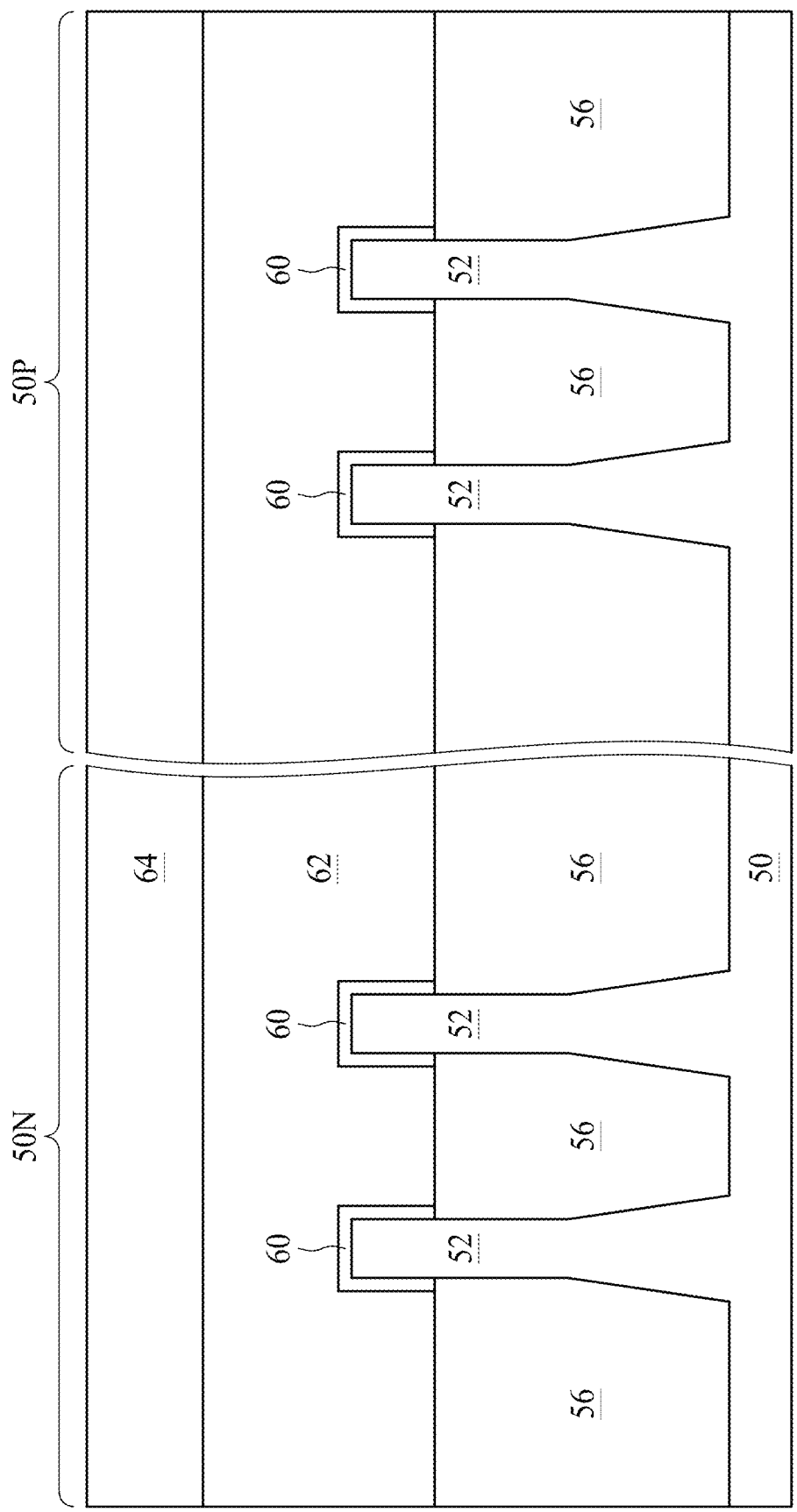

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 16B illustrate various additional steps in the manufacturing of embodiment devices. FIGS. 8A through 16B illustrate features in either of the n-type region 50N and the p-type region 50P. For example, the structures illustrated in FIGS. 8A through 16B may be applicable to both the n-type region 50N and the p-type region 50P. Differences (if any) in the structures of the n-type region 50N and the p-type region 50P are described in the text accompanying each figure.

Figure 8B:
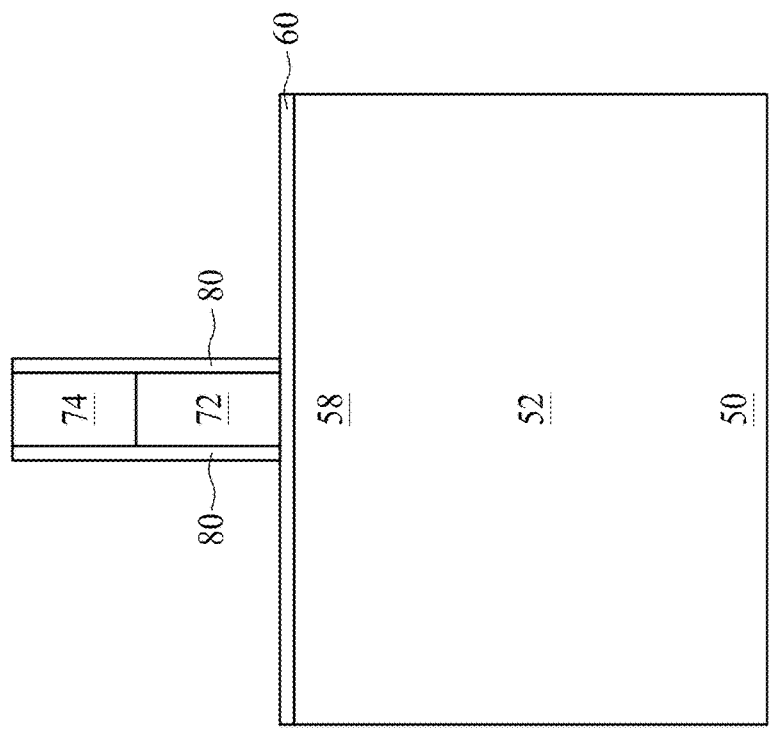
Figure 8A:
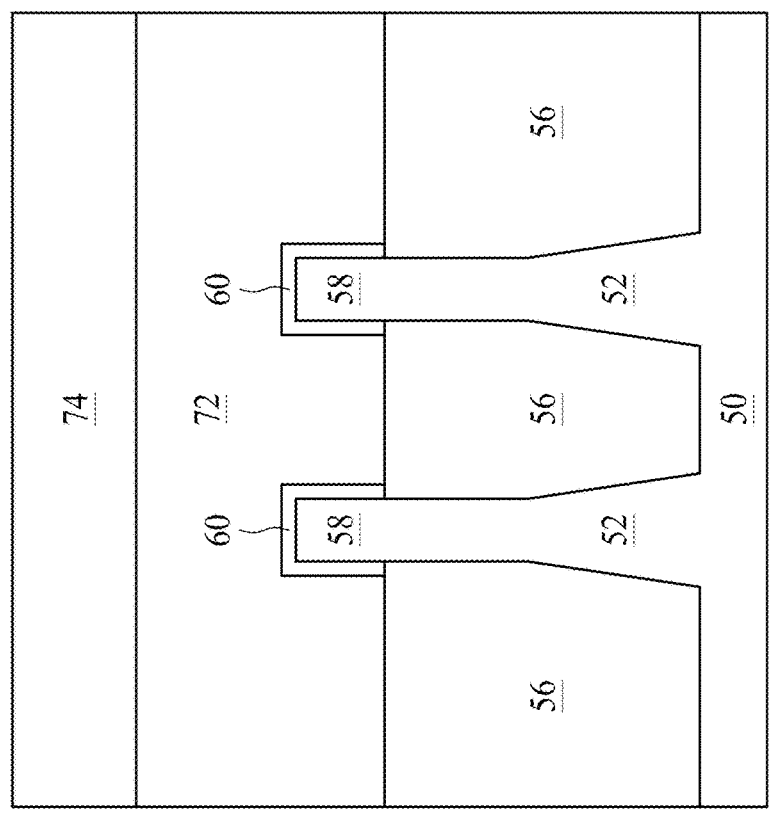

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9A:
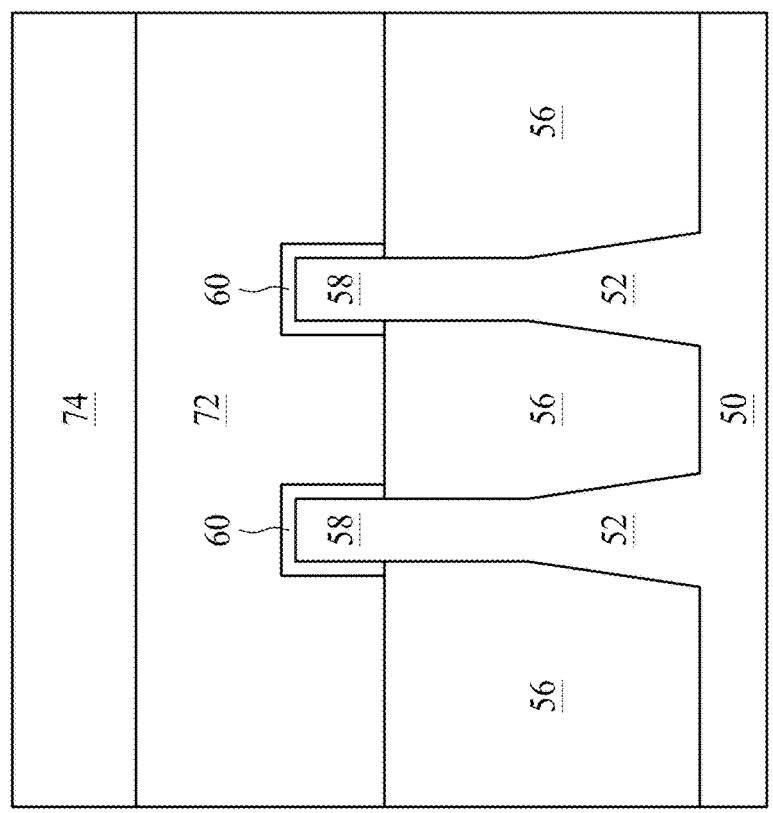
Figure 9B:
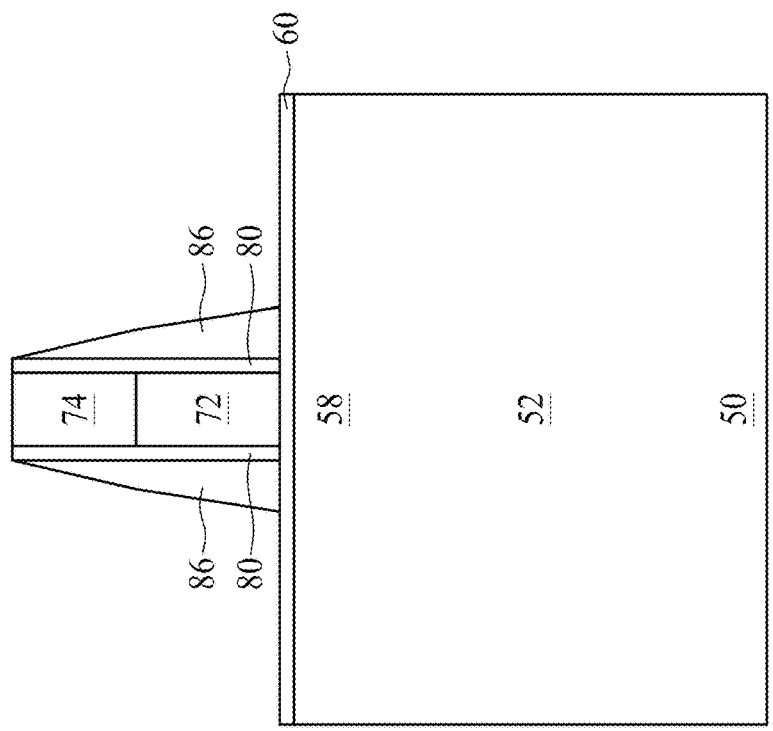

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
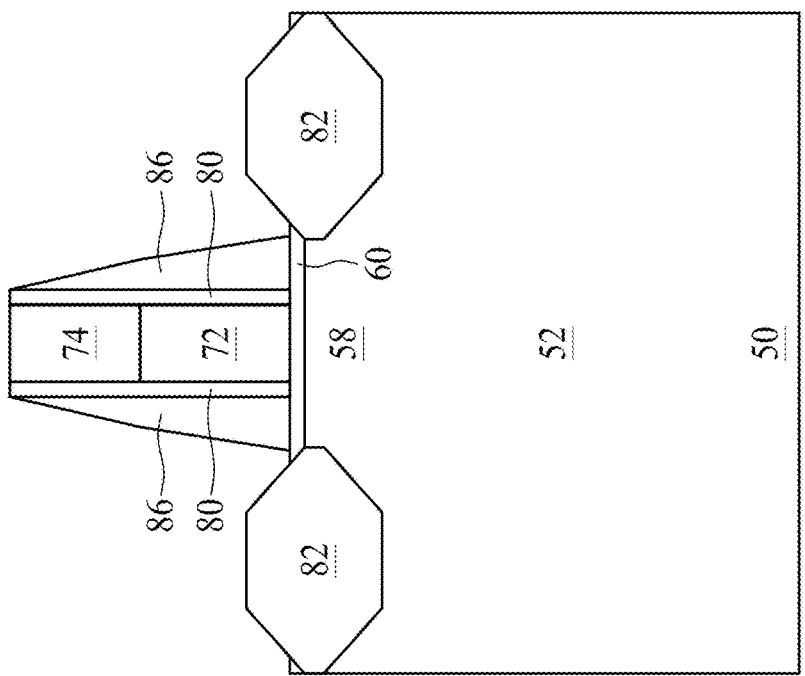
Figure 10A:
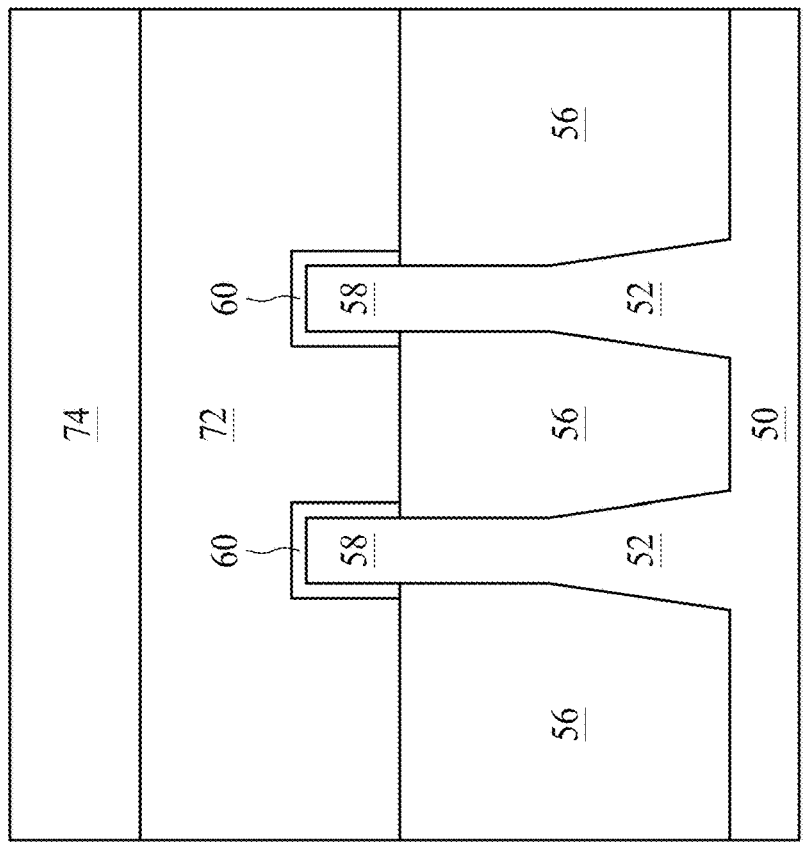

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 10C:
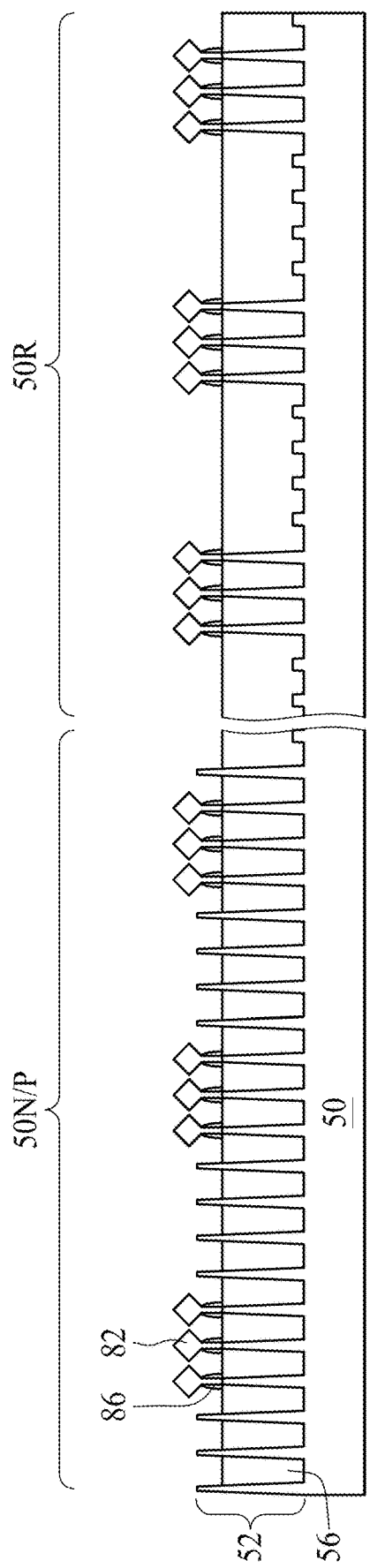
Figure 10E:
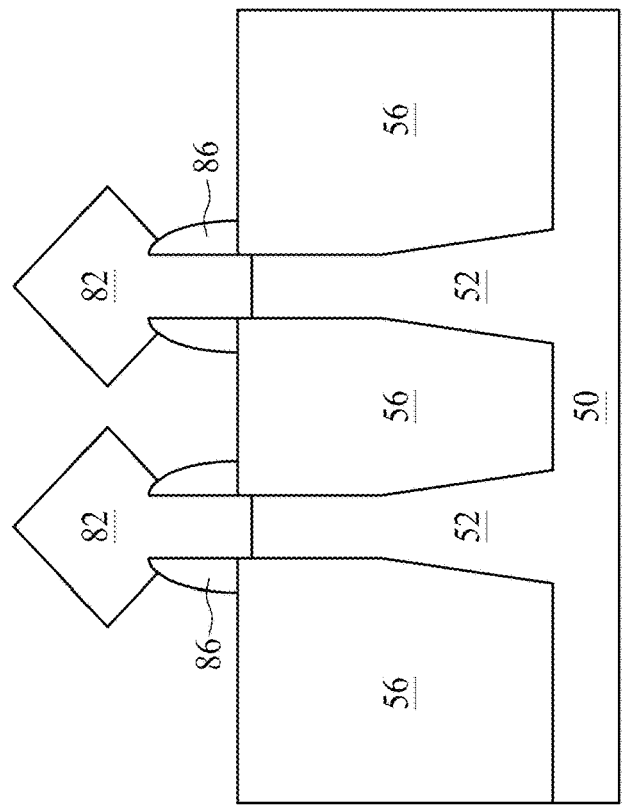
Figure 10D:
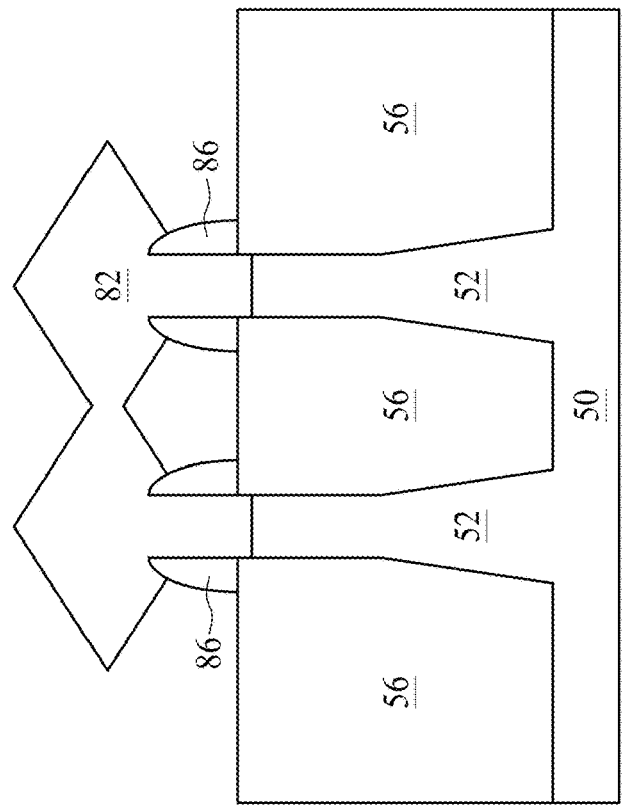

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10D. In other embodiments, adjacent source/drain regions 82 remain separated after the epitaxy process is completed as illustrated by FIGS. 10C and 10E. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
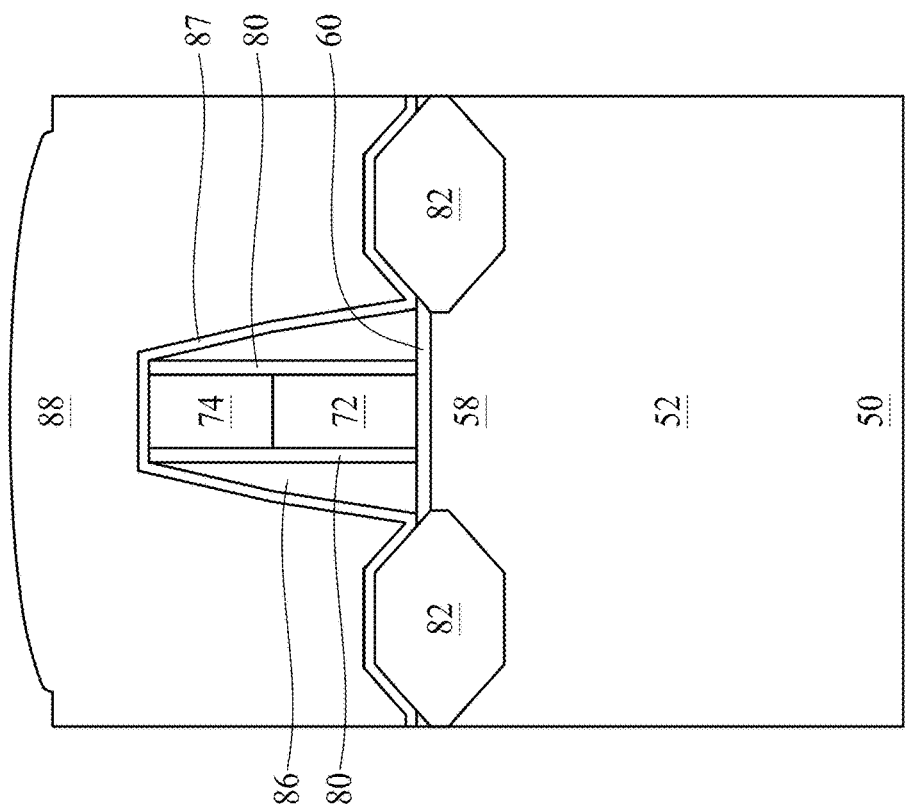
Figure 11A:
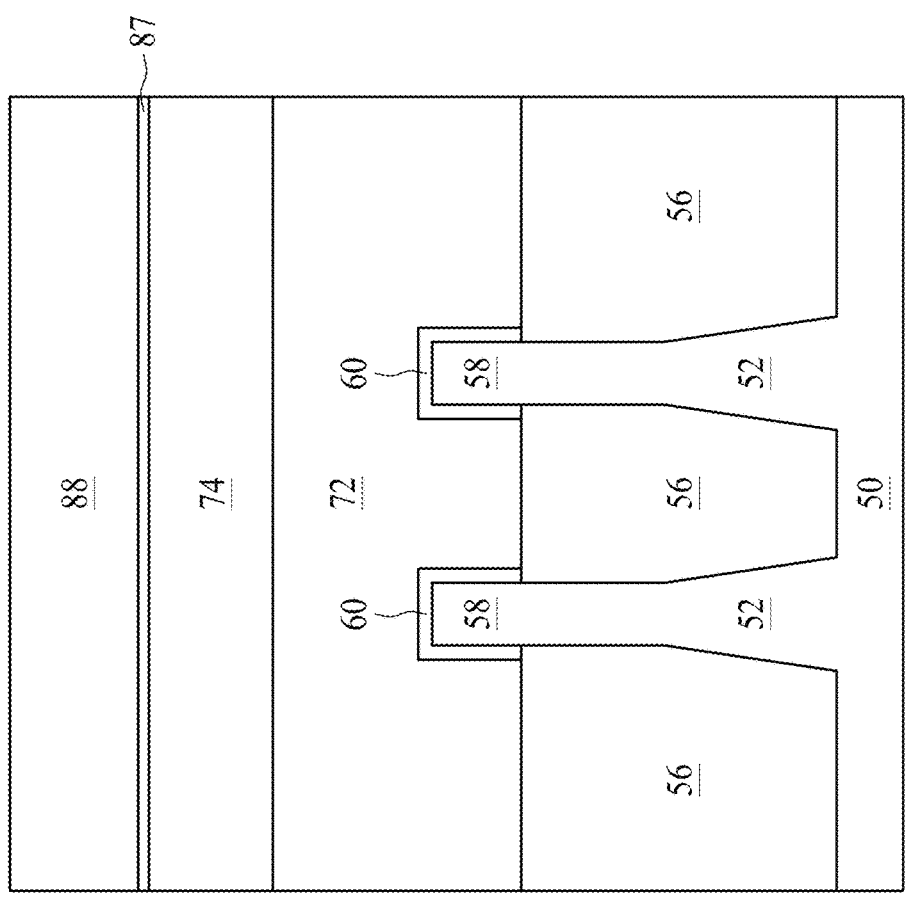

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12B:
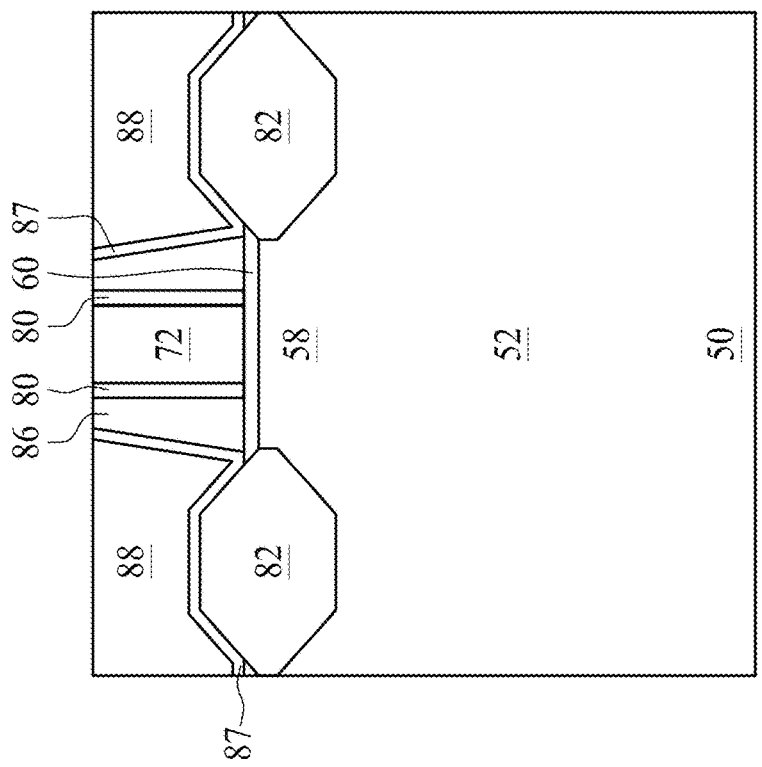
Figure 12A:
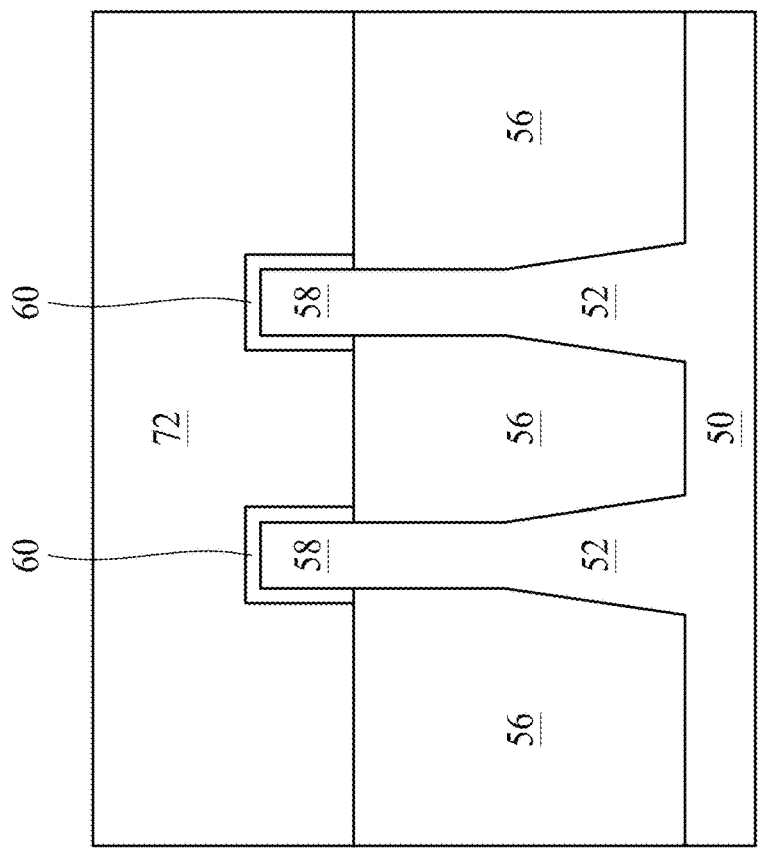

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surface of the masks 74.

Figure 13B:
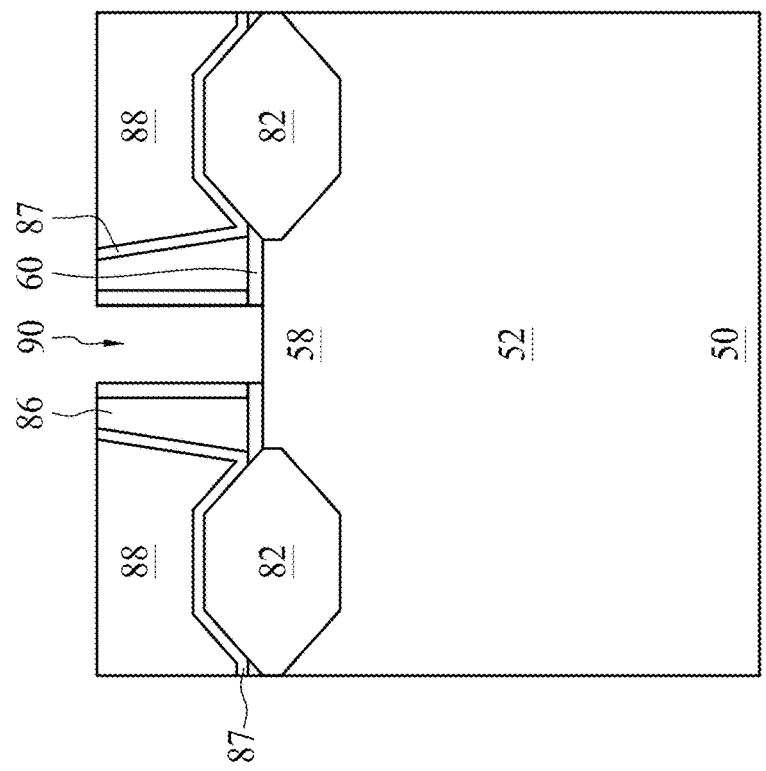
Figure 13A:
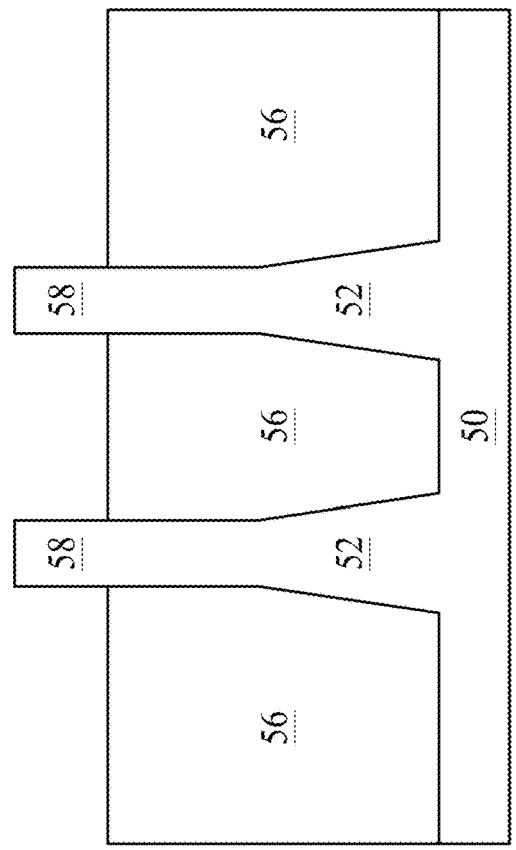

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
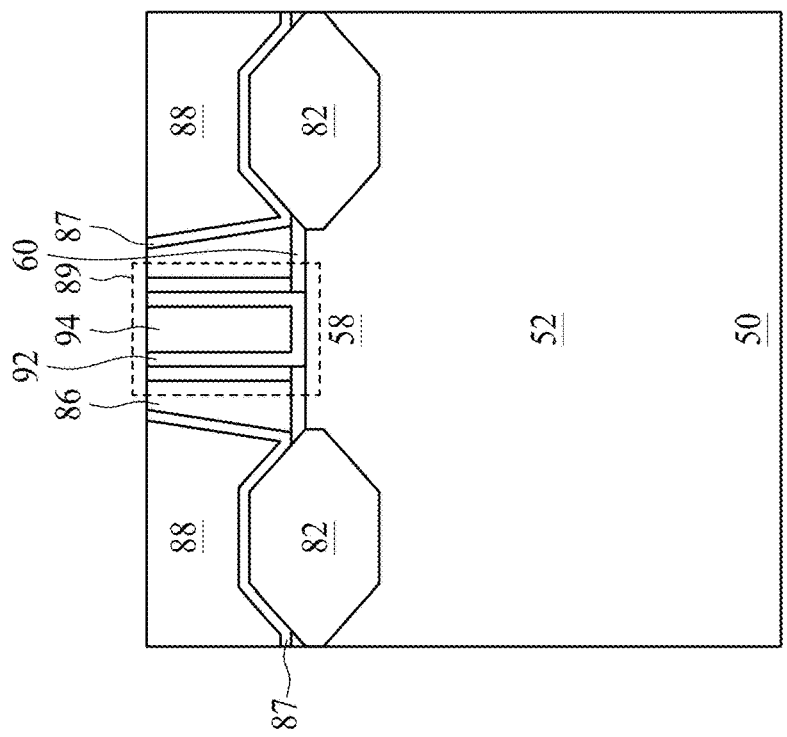
Figure 14A:
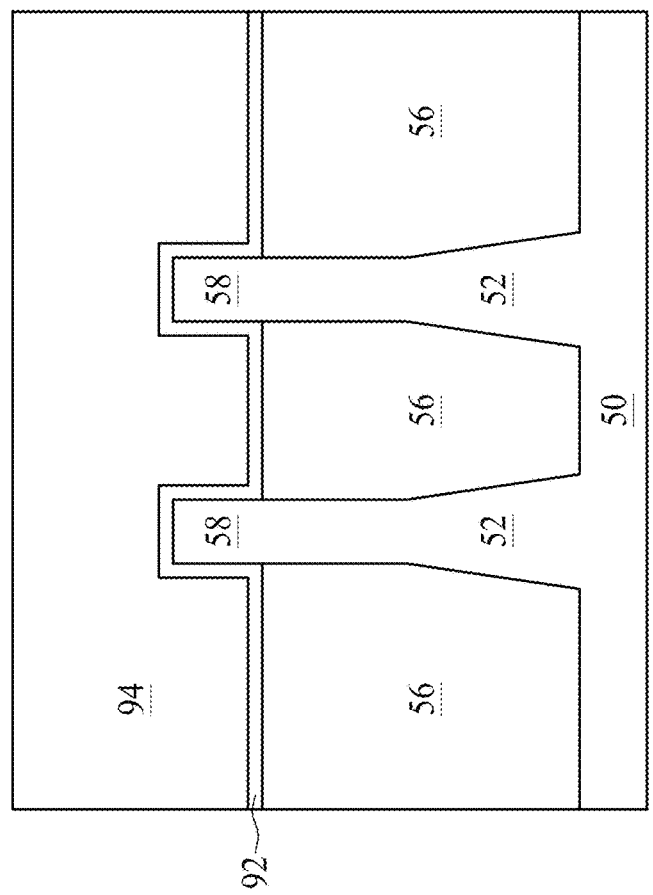
Figure 14C:
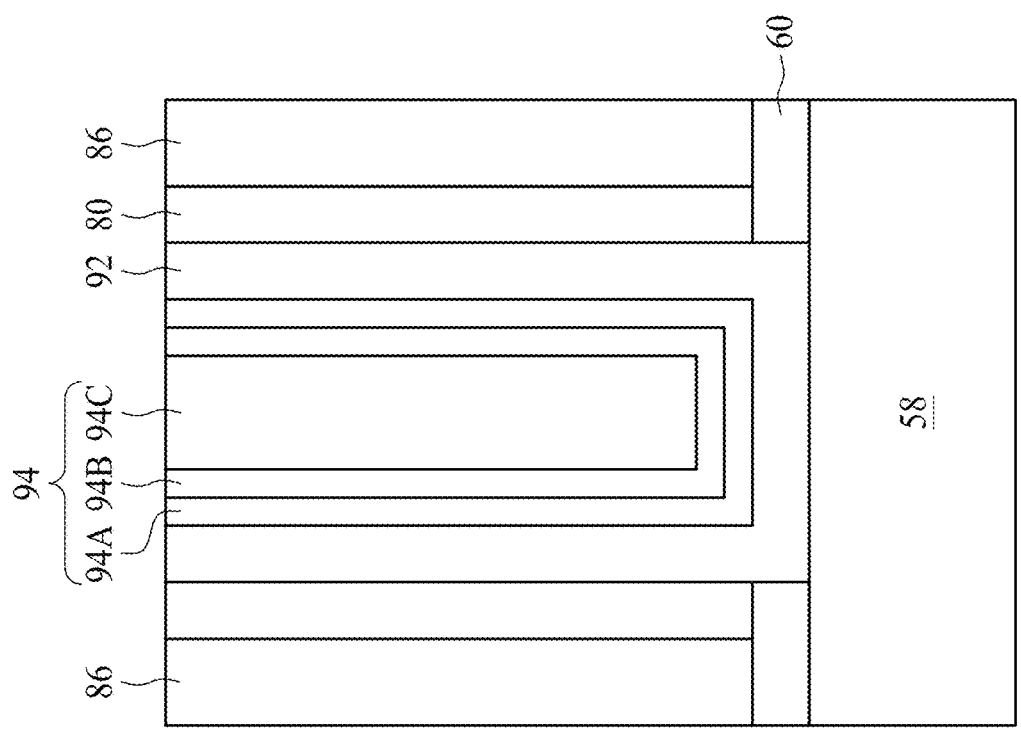

In FIGS. 14A and 14B, gate dielectric layers 92 and gate electrodes 94 are formed for replacement gates. FIG. 14C illustrates a detailed view of region 89 of FIG. 14B. Gate dielectric layers 92 may comprise one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 15B:
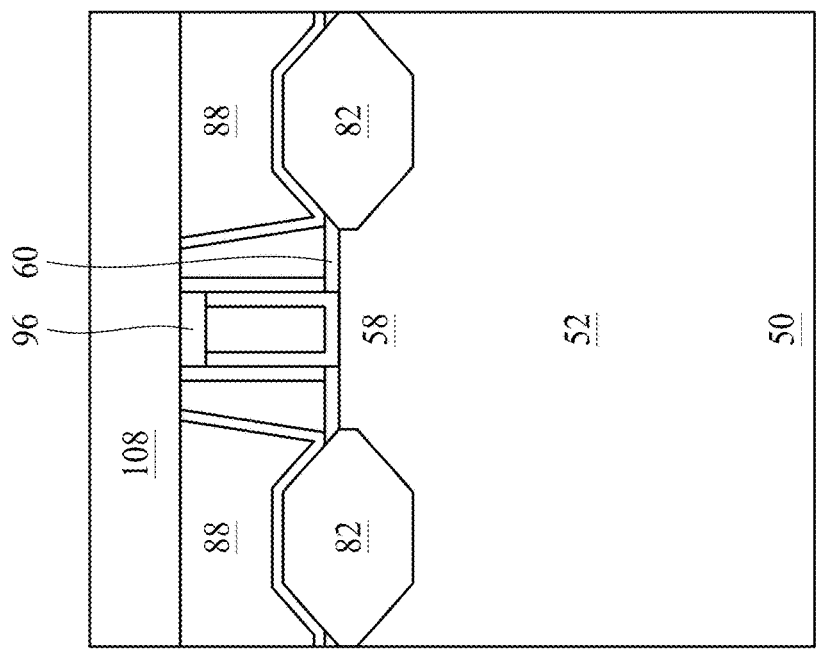
Figure 15A:
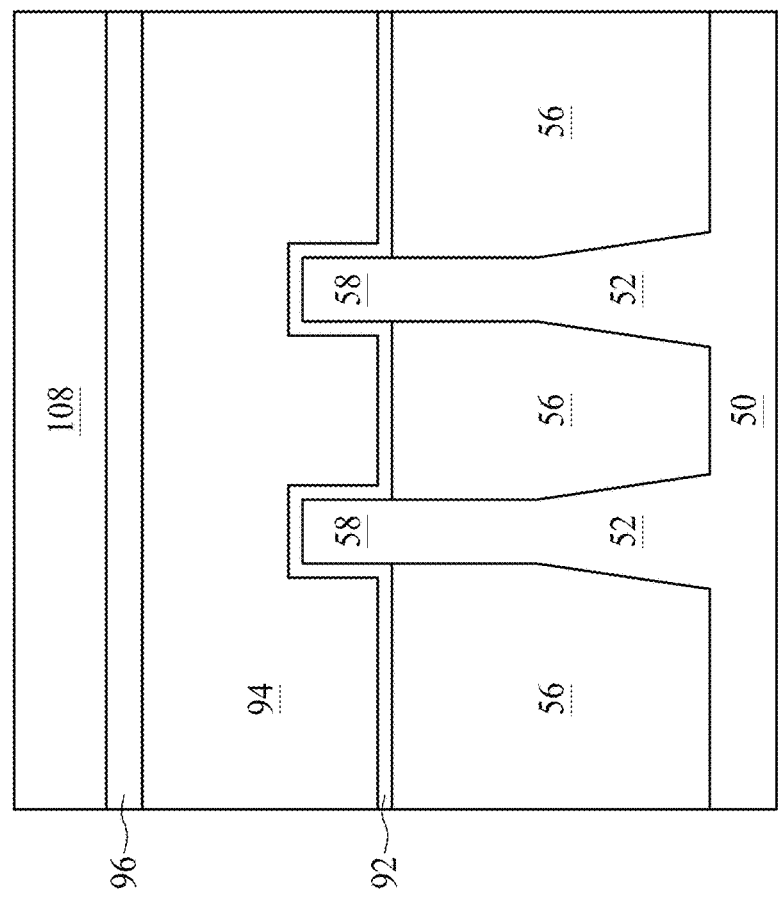

In FIGS. 15A and 15B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88. The gate mask 96 is optional and may be omitted in some embodiments. In such embodiments, the gate stack may remain level with top surfaces of the first ILD 88.

As also illustrated in FIGS. 15A and 15B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 16A and 16B) penetrate through the second ILD 108 and the gate mask 96 (if present) to contact the top surface of the recessed gate electrode 94.

Figure 16B:
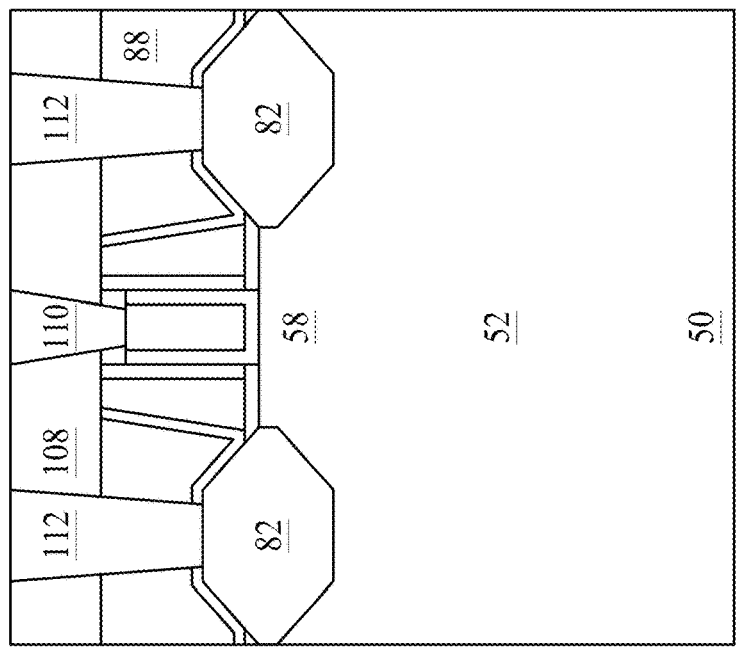
Figure 16A:
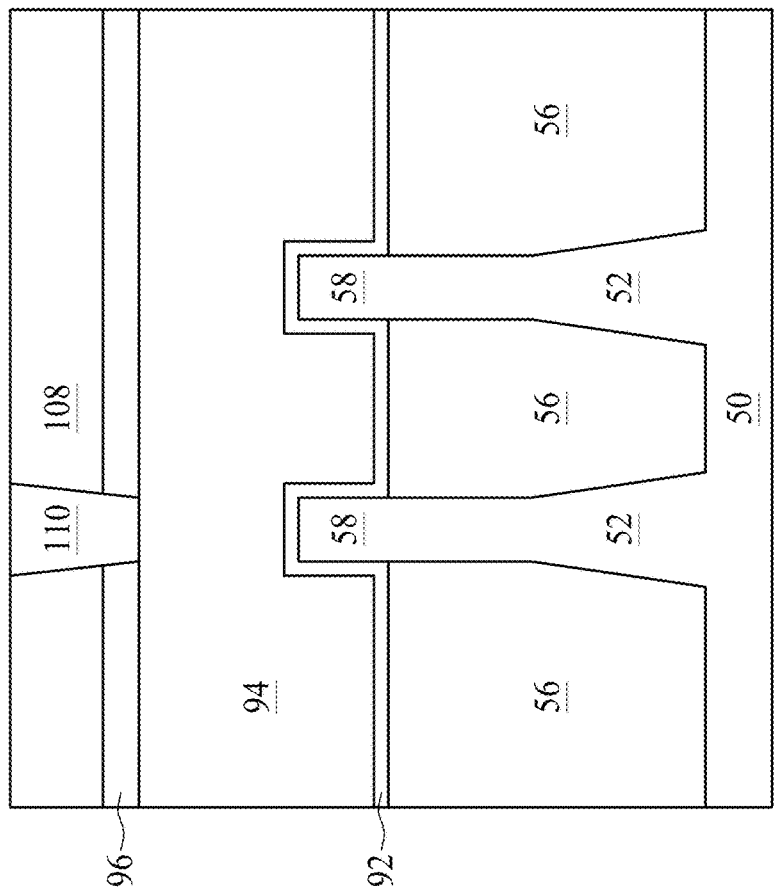

In FIGS. 16A and 16B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes or may be formed in the same process. Although shown as being formed in the same cross-sections, it should be appreciated that each of the source/drain contacts 112 and gate contacts 110 may be formed in different cross-sections, which may avoid shorting of the contacts.

Figure 17:
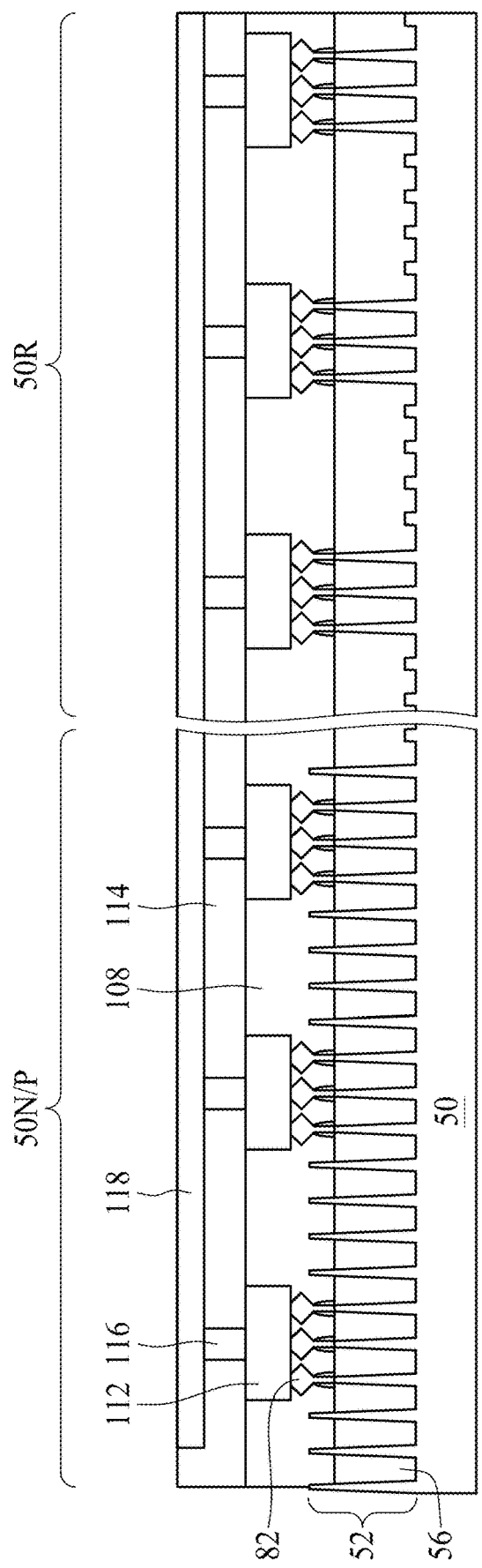

FIG. 17 illustrates a cross-sectional view similar to FIGS. 3B and 10C and illustrates further processing on the structures of FIGS. 16A and 16B. In FIG. 17, a third ILD 114 is deposited over the second ILD 108. In some embodiments, the third ILD 114 is similar to the second ILD 108 and the description is not repeated herein. Vias 116 and metallization patterns 118 are formed in the third ILD 114 and electrically connected to the source/drain contacts 112. The vias 116 and metallization patterns 118 formed by, for example, a damascene process. As illustrated in FIG. 17, the ILDs, vias, and metallization patterns are formed the same for the regions 50N/P and 50R. This design allows for this structure to be fully integrated into the CMOS process flows.

FIGS. 18A through 25 illustrate top views and cross-sectional views of various configurations of semiconductor devices in accordance with some embodiments.

FIG. 18A illustrates a top view of a semiconductor device 210 in accordance with some embodiments of the present disclosure. FIG. 18B illustrates a cross-sectional view of the semiconductor device 210 along a cross-section line 18B-18B in FIG. 18A in accordance with some embodiments of the present disclosure. FIG. 18C illustrates a cross-sectional view of the semiconductor device 210 along a cross-section line 18C-18C in FIG. 18A in accordance with some embodiments of the present disclosure. Referring to FIGS. 18A to 18C, the semiconductor device 210 includes a substrate 50, a plurality of fin structures 52, an isolation region 56, a plurality of gate structures 94, a plurality of epitaxy structures 82 (sometimes referred to as source/drain structures 82), and a plurality of contact structures 112. These structures have been previously described and their descriptions are not repeated herein. Details regarding this embodiment that are similar to those for the previously described embodiment will not be repeated herein.

In some embodiments, the fin structures 52 have a plurality of first fin structures 52A and a plurality of second fin structures 52B. In some embodiments, the plurality of first fin structures 52A and the plurality of second fin structures 52B are arranged in an alternating pattern with at least one of the second fin structures 52B separating first fin structures 52A from each other. Each of the first fin structure 52A has an epitaxy structure 82 is formed on the first fin structure 52A, and each of the second fin structures 52B do not have epitaxy structures 82 formed on them. In some embodiments, the second fin structures 52B separate and isolate the epitaxy structures 82 on the first fin structures 52A and may be referred to as isolation fin structures 52B. In some embodiments, each of the epitaxy structures 82 have at least one contact structure 112 formed on it. Each of the contact structures 112 is electrically connected to the at least one epitaxy structure 82. In accordance with some embodiments of the present disclosure, the semiconductor device 210 includes a plurality of resonators 217. In in the illustrated embodiment, each epitaxy structure 82 is only on a single first fin structure 52A although in other embodiments, the epitaxy structures 82 may be merged and formed on multiple first fin structures 52A (see, e.g., FIGS. 19A and 19B). The epitaxy structures 82 are between adjacent gate structures 94 with the gate structures 94 extending in a direction perpendicular to the fin structures 52. The gate structures 94 can be the replacement gate structures 94 or the dummy gate structures 72 described above.

In some embodiments, at least one second fin structure 52B is disposed between the two first fin structures 52A. In some embodiments, four second fin structures 52B are disposed between the two first fin structures 52A. In some embodiments, the output frequency of the resonator 217 may be determined by the number of the first fin structure 52A, the material composition of the first fin structures 52A, and the number of the second fin structure 52B between the first fin structures 52A.

In the embodiments illustrated in FIGS. 18A through 21B, the output frequency of the resonator 217 may be configured by the number of first fin structures 52A under a single merged epitaxy structure 82 and the number of second fin structures 52B. Further, in these embodiments, the material composition of the first fin structure 52A may be configured to tune the output frequency of the resonator 217. In the embodiment of FIG. 18A-C, the resonator 217 is configured where each epitaxy structure is on a single first fin structure 52A and each first fin structure 52A is separated by four second fin structures 52B.

FIG. 19A illustrates a top view of a semiconductor device 212 in accordance with some embodiments and FIG. 19B illustrates a cross sectional view of the semiconductor device 212 along a cross section line 19B-19B in FIG. 19A in accordance with some embodiments. Details regarding this embodiment that are similar to those for the previously described embodiments will not be repeated herein.

In the embodiment of FIG. 19A-B, the resonator 217 is configured where each epitaxy structure is on two adjacent first fin structures 52A and each pair of first fin structures 52A is separated by a single second fin structure 52B. The epitaxy structures 82 are between adjacent gate structures 94 with the gate structures 94 extending in a direction perpendicular to the fin structures 52. The gate structures 94 can be the replacement gate structures 94 or the dummy gate structures 72 described above.

FIG. 20A illustrates a top view of a semiconductor device 214 in accordance with some embodiments and FIG. 20B illustrates a cross sectional view of the semiconductor device 214 along a cross section line 20B-20B in FIG. 20A in accordance with some embodiments. Details regarding this embodiment that are similar to those for the previously described embodiments will not be repeated herein.

In the embodiment of FIG. 20A-B, the resonator 217 is configured where each epitaxy structure is on two adjacent first fin structures 52A and each pair of first fin structures 52A is separated by three second fin structures 52B. The epitaxy structures 82 are between adjacent gate structures 94 with the gate structures 94 extending in a direction perpendicular to the fin structures 52. The gate structures 94 can be the replacement gate structures 94 or the dummy gate structures 72 described above.

FIG. 21A illustrates a top view of a semiconductor device 216 in accordance with some embodiments and FIG. 21B illustrates a cross sectional view of the semiconductor device 216 along a cross section line 21B-21B in FIG. 21A in accordance with some embodiments. Details regarding this embodiment that are similar to those for the previously described embodiments will not be repeated herein.

In the embodiment of FIG. 21A-B, the resonator 217 is configured where each epitaxy structure is on three adjacent first fin structures 52A and each group of first fin structures 52A is separated by four second fin structures 52B. The epitaxy structures 82 are between adjacent gate structures 94 with the gate structures 94 extending in a direction perpendicular to the fin structures 52. The gate structures 94 can be the replacement gate structures 94 or the dummy gate structures 72 described above.

In the various configurations of the resonators 217, the output frequency of the resonator 217 may be configured by the number of first fin structures 52A under a single merged epitaxy structure 82 and the number of second fin structures 52B. Further, in these embodiments, the material composition of the first fin structure 52A may be configured to tune the output frequency of the resonator 217.

Figures 22, 23:
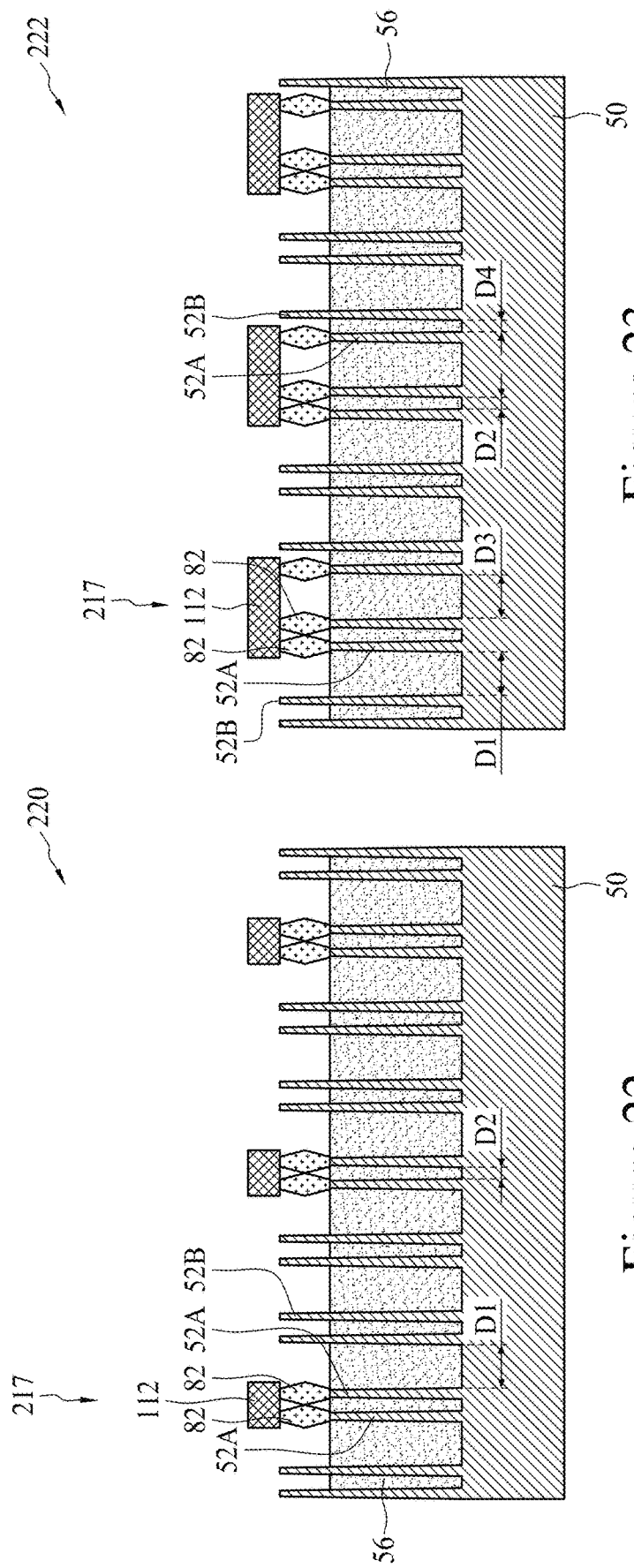

FIG. 22 illustrates a cross sectional view of a semiconductor device 220 in accordance with some embodiments. In this embodiment, the semiconductor device 220 has fin structures 52 that are grouped together such that there are multiple fin pitches in the semiconductor device 220. For example, a group of first or second fin structures 52A or 52B can have an internal distance D2 while each fin group is separated from adjacent fin groups by a distance D1. Details regarding this embodiment that are similar to those for the previously described embodiments will not be repeated herein.

In the embodiment of FIG. 22, the resonator 217 is configured where each epitaxy structure is on a group of two adjacent first fin structures 52A and each group of first fin structures 52A is separated by two groups of second fin structures 52B. In some embodiments, each first fin 52A within the groups of first fin structures 52A is separated by a distance D2. In some embodiments, each second fin structure 52B within the groups of second fin structures 52B is separated by the distance D2. In some embodiments, the distance D2 is in a range from 1 nm to 200 nm. In some embodiments, each of the groups of first fin structures 52A is separated from the nearest fin group (either first or second fin) by a distance D1. In some embodiments, the distance D1 is in a range from 1 nm to 200 nm. In some embodiments, D1 is different than D2. In some embodiments, D1 is less than D2, and in other embodiments, D1 is greater than D2.

In the various configurations of the resonators 217, the output frequency of the resonator 217 may be configured by the number of first fin structures 52A under a single merged epitaxy structure 82, the distance D2, the distance D1, the ratio D1 and D2, or a combination thereof.

FIG. 23 illustrates a cross sectional view of a semiconductor device 222 in accordance with some embodiments. This embodiment is similar to the embodiment of FIG. 22 and also includes multiple internal fin pitches and multiple epitaxy structures 82 connected to a single contact structure 112. Details regarding this embodiment that are similar to those for the previously described embodiments will not be repeated herein.

In the embodiment of FIG. 23, the resonator 217 is configured where each epitaxy structure is on a group of three adjacent first fin structures 52A. At least two of the first fin structures 52A in the group are separated by the distance D2. In addition, at least two of the first fin structures 52A are separated by a distance D3 which is different than D2. In some embodiments, the distance D3 is in a range from 1 nm to 200 nm. In some embodiments, D3 is different than D2. In some embodiments, D2 is less than D3, and in other embodiments, D2 is greater than D3.

In some embodiments, at least one of the first fin structures 52A in the group is separated from a nearest second fin structure 52B by a distance D4. In some embodiments, the distance D4 is in a range from 1 nm to 200 nm. In some embodiments, D1 is different than D4. In some embodiments, D1 is less than D4, and in other embodiments, D1 is greater than D4.

In the various configurations of the resonators 217, the output frequency of the resonator 217 may be configured by the number of first fin structures 52A under a single merged epitaxy structure 82, the number of epitaxy structures 82 under a single contact structure 112, the distance D2, the distance D1, the distance D3, the distance D4, the of ratio D1 and D2, the ratio of D3 and D2, the ratio of D1 and D4, or a combination thereof.

Figure 25:
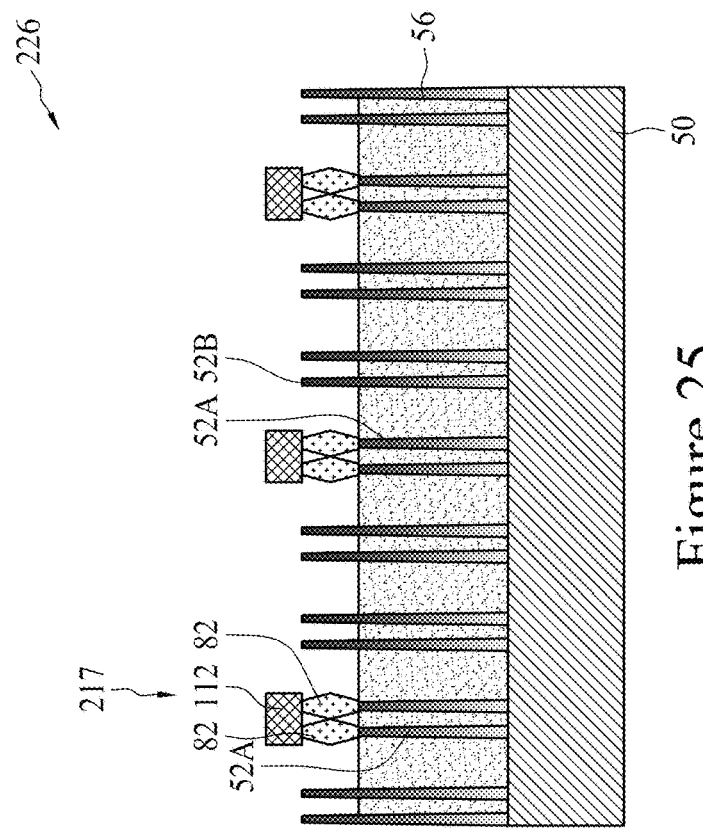
Figure 24:
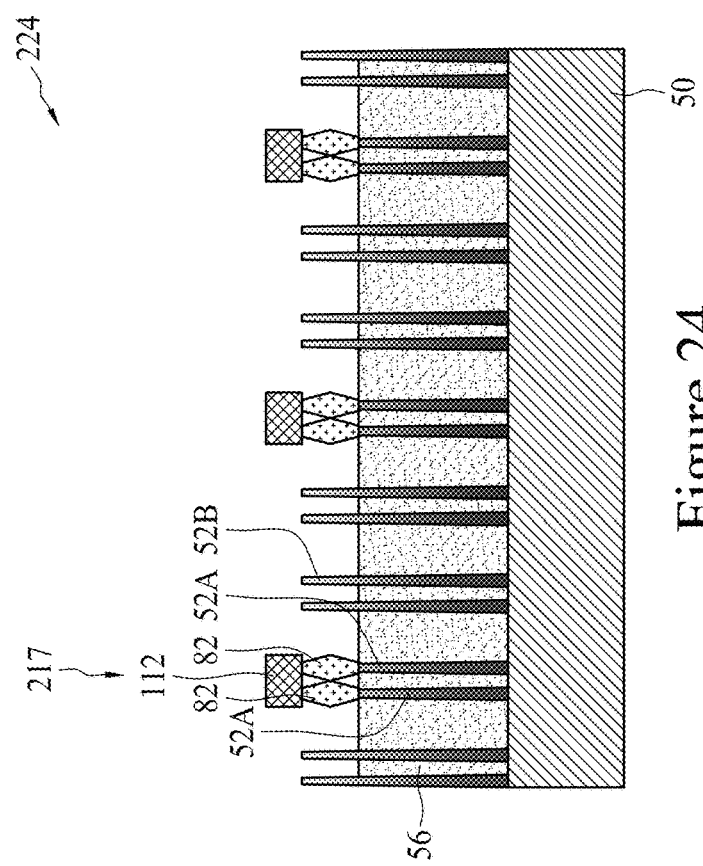

FIGS. 24 and 25 illustrate cross sectional views of semiconductor devices 224 and 226 in accordance with some embodiments. This embodiment is similar to the embodiment of FIG. 22 and also includes fin structures with gradient material composition. Details regarding this embodiment that are similar to those for the previously described embodiments will not be repeated herein.

In the embodiments of FIGS. 24 and 25, at least one first fin structure 52A has a gradient concentration material composition. In some embodiments, at least one first fin structure 52A has a gradient compound semiconductor material composition. In some embodiments, the at least first fin structure 52A has a gradient composition of SiGe material and may be a material composition of $Si_{1-x}Ge_x$, $0<x<1$. In FIG. 24, when going from a top portion of the at least one first fin structure 52A to a bottom portion of the at least one first fin structure 52A, the x value increases. In some embodiments, the x value increases from 0.01 to 0.99. In FIG. 25, when going from the top portion of the at least one first fin structure 52A to the bottom portion of the at least one first fin structure 52A, the x value decreases. In some embodiments, the x value decreases from 0.99 to 0.01.

In the various configurations of the resonators 217, the output frequency of the resonator 217 may be configured by the number of first fin structures 52A under a single merged epitaxy structure 82, the number of epitaxy structures 82 under a single contact structure 112, the gradient concentration of material of the at least one first fin structure 52A, the direction of the gradient concentration of material of the at least one first fin structure 52A, or a combination thereof.

Figure 26:
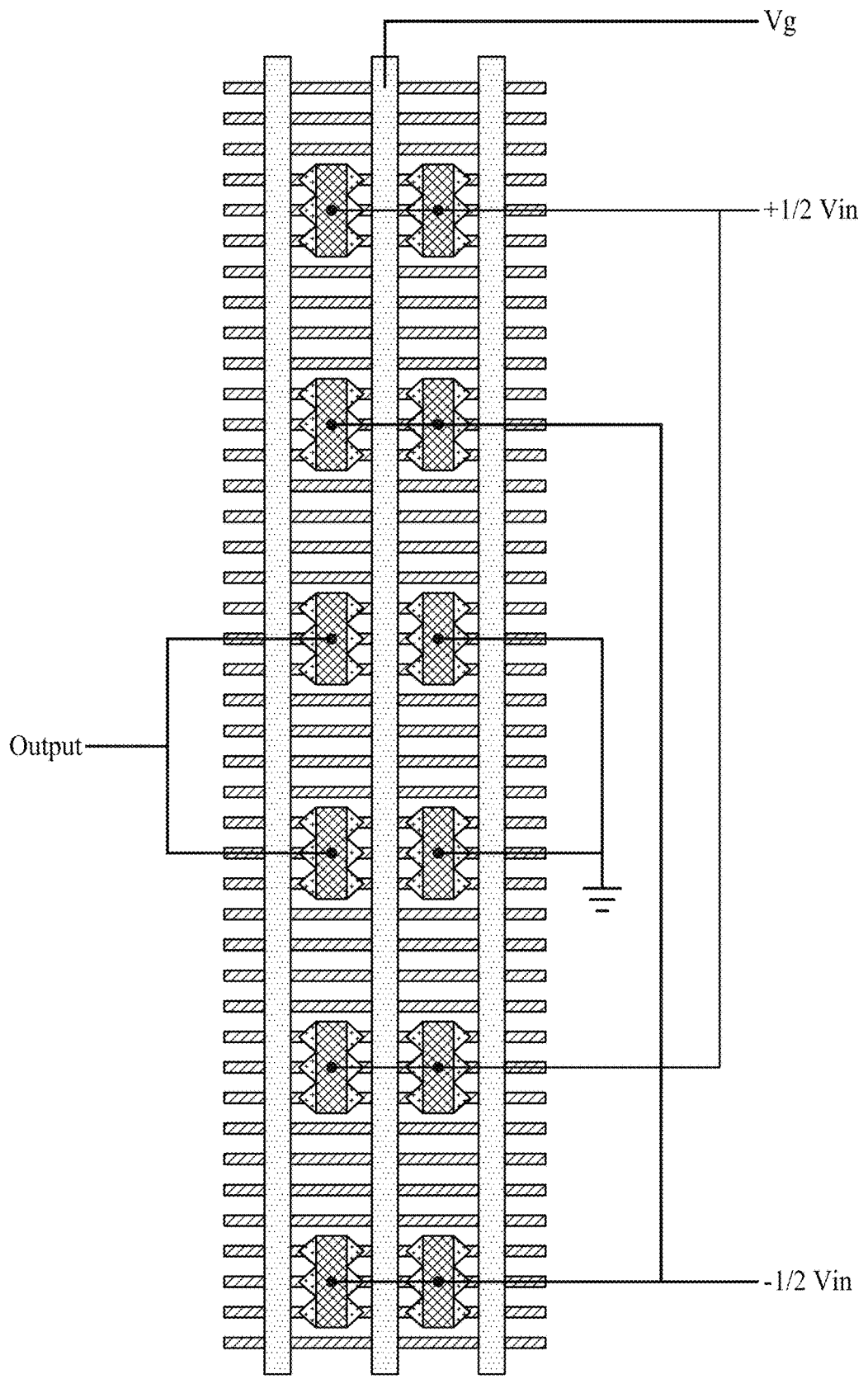
FIGS. 26 and 27 illustrate top views of various configurations of semiconductor devices in accordance with some embodiments.
Figure 27:
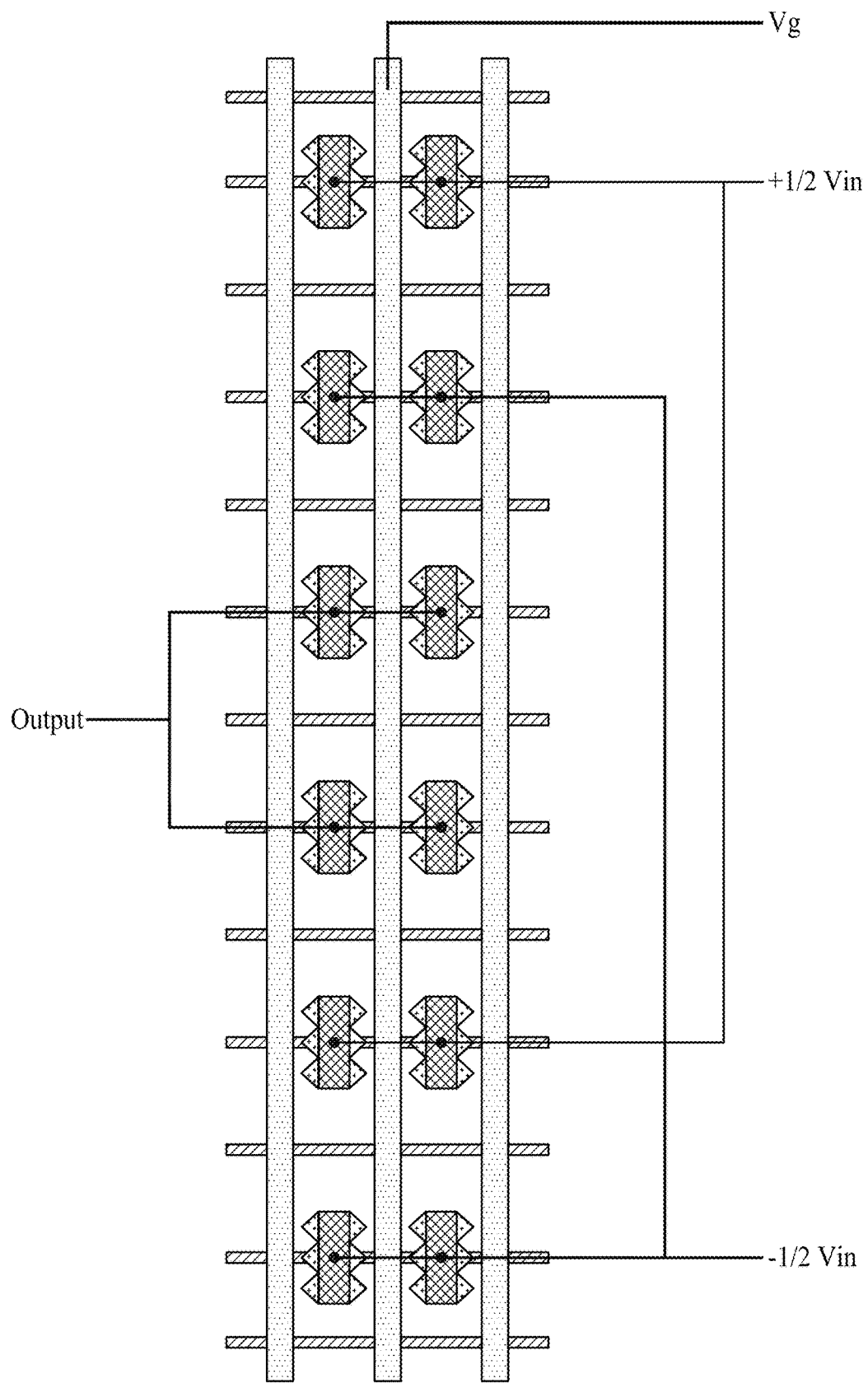

FIGS. 26 and 27 illustrate top views of example circuit configurations of operating the resonators 217 to generate an output frequency. In each example, outer contact structures 112 (e.g., the contact structures 112 at the top and bottom of the top views of FIGS. 26 and 27) are alternatingly coupled to a different input voltages Vin. In some embodiments, the input voltages Vin are alternating current (AC) signals. For example, in an embodiment, half of the outer contact structures 112 are coupled to a positive Vin (e.g., +½ Vin) and the other half of the outer contact structures 112 are coupled to a negative Vin (e.g., −½ Vin). In each example, one or more of the gate structures are coupled to a gate voltage Vg. In FIG. 26, the left side of the inner pair of contact structures 112 are coupled together to form an output signal (e.g., an output frequency) and the right side of the inner pair of contact structures are coupled to a low voltage such as ground. In the embodiment of FIG. 26, each epitaxy structure 82 and contact structure 112 are on multiple first fin structures 52A and there is multiple second fin structures 52B between each group of first fin structures 52A.

FIG. 27 is a minimal resonator configuration. In FIG. 27, the inner pair of contact structures 112 are coupled together and form an output signal (e.g., an output frequency). In the embodiment of FIG. 27, there are no second fin structures 52B between each first fin structure 52A and each epitaxy structure 82 is only on a single first fin structure 52A.

In both FIGS. 26 and 27, the input signal Vin and the gate voltage Vg generate vibrations in the fin structures based on the fin structure's resonance. In some embodiments, this vibration causes capacitance variance and carrier movement in fins, and generates a sense current with high frequency. In some embodiments, the resonant frequency of the fin structures is related to the material properties such as Young's modulus, mass density, geometry, the like, or a combination thereof.

As an example, the gate structure 94 creates a capacitor with the first fin structures 52A with the gate dielectric between the two. Thus, when the gate voltage Vg is applied to the gate electrostatic forces can squeeze the dielectric which in turn squeezes the first fin structure 52A. A regular series of voltage pulses as the gate voltage Vg can create a periodic pulsing in the fin structures 52A. By spacing a series of first and second fin structures 52A and 52B in various configurations way and connecting them all with the gate structures 94, the resonator 217 can resonate at various frequencies from the megahertz to the gigahertz range.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments disclosed herein may achieve advantages. The disclosed device and method includes using a fin structure to make a resonator which may be used as a frequency source in circuits. In some embodiments, the frequency generated by the device is determined by the fin material and the fin pitch. The device design allows for this structure to be better integrated into complementary metal-oxide-semiconductor (CMOS) process flows. The disclosed embodiments allow for the device to generate more than one frequency in one structure while also simplifying process and not requiring special packaging.

An embodiment includes a semiconductor device, a plurality of fin structures extending from a substrate, the plurality of fin structures having a plurality of first fin structures and a plurality of second fin structures. The semiconductor device also includes a plurality of isolation regions on the substrate and disposed between the plurality of fin structures. The device also includes a plurality of gate structures on the plurality of isolation regions. The device also includes a plurality of epitaxy structures on one of the plurality of first fin structures. The device also includes a plurality of contact structures on the plurality of epitaxy structures, where the plurality of first fin structures, the plurality of gate structures, the plurality of epitaxy structures, and the plurality of contact structures are components of one or more resonators.

Embodiments may include one or more of the following features. The semiconductor device where the one or more resonators includes one contact structure, one epitaxy structure and one first fin structure. At least one of the plurality of second fin structures is disposed between two of the plurality of first fin structures. A plurality of second fin structures is disposed between two of the plurality of first fin structures. The one or more resonators includes one contact structure, the plurality of epitaxy structures, and the plurality of first fin structures. At least one of the plurality of gate structures extends between the plurality of epitaxy structures, the plurality of first fin structures and the plurality of second fin structures arranged in an alternating pattern, at least one of the plurality of second fin structures separating two of the plurality of first fin structures. Each first fin structure includes a gradient material composition going from a top portion of the first fin structures to a bottom portion of the first fin structures. One of the plurality of first fin structures has a first sidewall facing a first direction and a second sidewall facing a second direction, the second direction being opposite the first direction, the first sidewall being separated from a nearest fin structure in the first direction by a first distance, the second sidewall being separated from a nearest fin structure in the second direction by a second distance, the second distance being different than the first distance. Nearest fin structure in the first direction is a first fin structure, and where the nearest fin structure in the second direction is a second fin structure.

An embodiment includes a semiconductor device, a substrate having a first surface and a second surface. The semiconductor device also includes an isolation structure over the first surface of the substrate. The device also includes a plurality of gate structures over the isolation structure. The device also includes a resonator including a plurality of first fin structures, at least one epitaxy structure, and a contact structure, the plurality of first fin structures on the first surface of the substrate, the at least one epitaxy structure on the first fin structure, the contact structure on the at least one epitaxy structure. The device also includes at least one second fin structure on the first surface of the substrate, and the at least one second fin structure disposed between two of the plurality of first fin structures, the at least one second fin structure being free of epitaxy structures.

Embodiments may include one or more of the following features. The semiconductor device where an output frequency of the resonator is based on a pitch of first fin structures and a material composition of the first fin structures. A plurality of second fin structures is disposed between two of the first fin structures, where there are no first fin structures between the two first fin structures. Each first fin structure includes a compound semiconductor material. Each first fin structure includes a gradient material composition going from a top portion of the first fin structures to a bottom portion of the first fin structures. One of the plurality of first fin structures has a first sidewall facing a first direction and a second sidewall facing a second direction, the second direction being opposite the first direction, the first sidewall being separated from a nearest fin structure in the first direction by a first distance, the second sidewall being separated from a nearest fin structure in the second direction by a second distance, the second distance being different than the first distance.

An embodiment includes forming a plurality of fin structures extending from a substrate, the fin structures having a plurality of first fin structures and a plurality of second fin structures. The method also includes forming a plurality of isolation regions on the substrate and disposed between the plurality of fin structures. The method also includes forming a plurality of gate structures on the isolation regions. The method also includes growing a plurality of epitaxy structures on the plurality of first fin structures, the plurality of second fin structure being free of epitaxy structures. The method also includes forming a plurality of contact structures on the plurality of epitaxy structures, where the plurality of first fin structures, the plurality of gate structures, the plurality of epitaxy structures, and the plurality of contact structures are components of one or more resonators.

Embodiments may include one or more of the following features. The method where material of at least one first fin structure is $Si_{1-x}Ge_x$, $0<x<1$. From a top portion of the at least one first fin structure to a bottom portion of the at least one first fin structure, the x value increases. From a top portion of the at least one first fin structure to a bottom portion of the at least one first fin structure, the x value decreases. A plurality of second fin structures is disposed between two of the first fin structures, where there are no first fin structures between the two first fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of fin structures extending from a substrate, the plurality of fin structures having a plurality of first fin structures and a plurality of second fin structures;
   a plurality of isolation regions on the substrate and disposed between the plurality of fin structures;
   a plurality of gate structures on the plurality of isolation regions;
   a plurality of epitaxy structures on one of the plurality of first fin structures, each of the plurality of epitaxy structures being on three first fin structures, the three first fin structures having two different distances between adjacent fin structures of the first fin structures;
   a plurality of contact structures on the plurality of epitaxy structures, wherein the plurality of first fin structures, the plurality of gate structures, the plurality of epitaxy structures, and the plurality of contact structures are components of one or more resonators; and
   wherein one of the three of first fin structures has a first sidewall facing a first direction and a second sidewall facing a second direction, the second direction being opposite the first direction, the first sidewall being separated from a nearest fin structure in the first direction by a first distance of the two different distances, the second sidewall being separated from a nearest fin structure in the second direction by a second distance of the two different distances, the second distance being different than the first distance.

2. The semiconductor device of claim 1, wherein at least one of the plurality of second fin structures is disposed between two groups of the plurality of first fin structures.

3. The semiconductor device of claim 2, wherein the plurality of second fin structures is disposed between two groups of the plurality of first fin structures.

4. The semiconductor device of claim 1, wherein at least one of the plurality of gate structures extends between the plurality of epitaxy structures, the plurality of first fin structures and the plurality of second fin structures arranged in an alternating pattern, at least one of the plurality of second fin structures separating two groups of the plurality of first fin structures.

5. The semiconductor device of claim 1, wherein the nearest fin structure in the first direction is a first fin structure of the three first fin structures, and wherein the nearest fin structure in the second direction is a second fin structure of the three first fin structures.

6. A semiconductor device, comprising:
   a substrate having a first surface and a second surface;
   an isolation structure over the first surface of the substrate;
   a plurality of gate structures over the isolation structure;
   a resonator comprising a plurality of first fin structures, at least one epitaxy structure, and a contact structure, the plurality of first fin structures on the first surface of the substrate, the at least one epitaxy structure on a group of the plurality of first fin structures, the contact structure on the at least one epitaxy structure, the group of first fin structures comprising a left fin structure, a middle fin structure, and a right fin structure, the left and middle fin structures being separated by a first distance, the right and middle fin structures being separated by a second distance different from the first distance;

at least one second fin structure on the first surface of the substrate, and the at least one second fin structure disposed between two groups of the plurality of first fin structures, the at least one second fin structure being free of epitaxy structures; and wherein the middle fin structure has a first sidewall facing a first direction and a second sidewall facing a second direction, the second direction being opposite the first direction, the first sidewall being separated from the left fin structure in the first direction by the first distance, the second sidewall being separated from a third fin structure in the second direction by the second distance.

7. The semiconductor device of claim 6, wherein an output frequency of the resonator is based on a pitch of the first fin structures and a material composition of the first fin structures.

8. The semiconductor device of claim 6, wherein a plurality of second fin structures is disposed between the two groups of the first fin structures, wherein there are no first fin structures between the two groups of the first fin structures.

9. The semiconductor device of claim 6, wherein each first fin structure comprises a compound semiconductor material.

10. A semiconductor device, comprising:
a substrate having a first surface;
a plurality of first fin structures on the first surface of the substrate, wherein each of the first fin structures comprises a semiconductor material;
an epitaxy structure on a group of three adjacent first fin structures, wherein at least two of the first fin structures within the group are separated by a first distance and at least two of the first fin structures are separated by a the group of three adjacent fin structures comprise a left fin structure, a middle fin structure, and a right fin structure, the left and middle fin structures being separated by a first distance, the right and middle fin structures being separated by a second distance different from the first distance;

a contact structure formed on the epitaxy structure;

at least one second fin structure on the first surface of the substrate, the at least one second fin structure disposed between groups of the three adjacent first fin structures, wherein the at least one second fin structure is free of epitaxy structures; and wherein the middle fin structure has a first sidewall facing a first direction and a second sidewall facing a second direction, the second direction being opposite the first direction, the first sidewall being separated from the left fin structure in the first direction by the first distance, the second sidewall being separated from a third fin structure in the second direction by the second distance.

11. The semiconductor device of claim 10, wherein the at least one second fin structure is separated from the nearest first fin structure by a third distance.

12. The semiconductor device of claim 11, wherein the third distance is different from the first distance and the second distance.

13. The semiconductor device of claim 10, wherein the epitaxy structure and the contact structure are part of a resonator configured to generate an output frequency based on a pitch of the first fin structures and a material composition of the first fin structures.

14. The semiconductor device of claim 10, wherein the semiconductor material of the first fin structures is silicon-germanium (SiGe).

* * * * *